(12) United States Patent
Yang

(10) Patent No.: US 12,740,433 B2
(45) Date of Patent: Sep. 15, 2026

(54) SEMICONDUCTOR INTEGRATED CIRCUIT, SEMICONDUCTOR DEVICE AND METHOD FOR ALIGNING SEMICONDUCTOR INTEGRATED CIRCUITS

(71) Applicant: MACRONIX INTERNATIONAL CO., LTD., Hsinchu (TW)

(72) Inventor: Chin-Cheng Yang, Kaohsiung County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 436 days.

(21) Appl. No.: 18/346,910

(22) Filed: Jul. 5, 2023

(65) Prior Publication Data

US 2025/0015012 A1 Jan. 9, 2025

(51) Int. Cl.

| | |
|---|---|
| ***H10W 46/00*** | (2026.01) |
| ***H10P 74/20*** | (2026.01) |
| *H10W 80/00* | (2026.01) |
| *H10W 90/00* | (2026.01) |

(52) U.S. Cl.

CPC ........... *H10W 46/00* (2026.01); *H10P 74/203* (2026.01); *H10W 46/301* (2026.01); *H10W 80/163* (2026.01); *H10W 90/792* (2026.01)

(58) Field of Classification Search

CPC ....... H01L 23/544; H01L 24/00; H01L 22/12; H01L 2223/54426; H01L 2224/08145; H01L 2224/8013; H01L 2223/5442; H10W 70/65; H10W 70/69; H10W 90/701; H10W 46/101; H10W 46/301; H10W 46/503; H10W 42/121; H10W 20/42; H10W 20/435; H10W 20/4421; H10W 20/4441; H10W 20/47; H10W 46/00; G03F 9/7076; G03F 9/7084

See application file for complete search history.

(56) References Cited

U.S. PATENT DOCUMENTS 6,083,807 A * 7/2000 Hsu .................... G03F 7/70633 257/E23.179
10,504,852 B1 * 12/2019 Chen .................... H01L 23/544
2007/0246843 A1 * 10/2007 Yang .................... H01L 23/544 257/E23.179
2011/0285036 A1 * 11/2011 Yao .................... G03F 7/70633 257/E23.179

* cited by examiner

*Primary Examiner* — Britt Hanley
*Assistant Examiner* — Victor V Barzykin
(74) *Attorney, Agent, or Firm* — McClure, Qualey & Rodack, LLP

(57) ABSTRACT

A semiconductor integrated circuit, a semiconductor device and a method for aligning semiconductor integrated circuits are provided. The semiconductor integrated circuit includes a substrate and an overlay mark structure in the substrate. The overlay mark structure includes first overlay marks and second overlay marks separated from each other. A first mark width of the first overlay marks is smaller than a second mark width of the second overlay marks.

9 Claims, 20 Drawing Sheets

A A'
251 252 256 255 257 258 254 253
100

210-1{251, 252} 210-2{253, 254} 211-1{255, 256} 211-2{257, 258}

701A { 710-1, 710-2, 710-3, 710-4, 711-1, 711-2, 711-3, 711-4

701B { 721-1, 721-2, 721-3, 721-4

801A: 810-1, 810-2, 810-3, 810-4, 811-1, 811-2, 811-3, 811-4

801B: 821-1, 821-2, 821-3, 821-4

901A { 910-1 910-2 910-3 910-4 911-1 911-2 911-3 911-4

901B { 921-1 921-2 921-3 921-4

10A { 10-1A, 10-1B, 10-2A, 10-2B, 10-3A, 10-3B, 10-4A, 10-4B, 11-1, 11-2, 11-3, 11-4

10B { 21-1, 21-2, 21-3, 21-4

40A { 40-1A, 40-1B, 40-2A, 40-2B, 40-3A, 40-3B, 40-4A, 40-4B, 41-1, 41-2, 41-3, 41-4

40B { 51-1, 51-2, 51-3, 51-4

SEMICONDUCTOR INTEGRATED CIRCUIT, SEMICONDUCTOR DEVICE AND METHOD FOR ALIGNING SEMICONDUCTOR INTEGRATED CIRCUITS

BACKGROUND

Technical Field

The disclosure relates to a semiconductor integrated circuit, a semiconductor device including semiconductor integrated circuits and a method for aligning semiconductor integrated circuits.

Description of the Related Art

In semiconductor integrated circuit (IC) fabrication, alignment process is the technique of aligning semiconductor integrated circuits with each other using alignment marks and/or overlay marks. A planarization process is usually performed to the semiconductor integrated circuits to be bonded before aligning and bonding the semiconductor integrated circuits. However, such planarization process may cause the alignment marks and/or overlay marks to be asymmetrical. Asymmetrical alignment marks and/or overlay marks may cause detection error of the alignment marks and/or overlay marks, resulting in misalignment between the semiconductor integrated circuits.

SUMMARY

The present disclosure relates to a semiconductor integrated circuit including an overlay mark structure, a semiconductor device including semiconductor integrated circuits and a method for aligning semiconductor integrated circuits. The overlay mark structure of the semiconductor integrated circuit includes a first overlay mark and a second overlay mark with different widths so as to improve alignment accuracy.

According to an embodiment of the present disclosure, a semiconductor integrated circuit is provided. The semiconductor integrated circuit includes a substrate and an overlay mark structure in the substrate. The overlay mark structure includes first overlay marks and second overlay marks separated from each other. A first mark width of the first overlay marks is smaller than a second mark width of the second overlay marks.

According to another embodiment of the present disclosure, a semiconductor device is provided. The semiconductor device includes a first semiconductor integrated circuit and a second semiconductor integrated circuit disposed on the first semiconductor integrated circuit along a first direction. The first semiconductor integrated circuit includes a first overlay mark structure. The first overlay mark structure includes a first overlay mark and a second overlay mark separated from each other. A first mark width of the first overlay mark of the first overlay mark structure is smaller than a second mark width of the second overlay mark of the first overlay mark structure. The second semiconductor integrated circuit includes a second overlay mark structure including a third overlay mark. The third overlay mark of the second overlay mark structure at least partially overlaps the first overlay mark of the first semiconductor integrated circuit along the first direction.

According to yet another embodiment of the present disclosure, a method for aligning semiconductor integrated circuits is provided. The method for aligning semiconductor integrated circuits includes: providing a first semiconductor integrated circuit, wherein the first semiconductor integrated circuit comprises a first overlay mark structure and a first alignment mark structure in different regions of the first semiconductor integrated circuit; providing a second semiconductor integrated circuit, wherein the second semiconductor integrated circuit comprises a second overlay mark structure and a second alignment mark structure in different regions of the second semiconductor integrated circuit; performing a measurement process comprising detecting the first overlay mark structure of the first semiconductor integrated circuit to obtain an offset value; performing an alignment process comprising detecting the first alignment mark structure of the first semiconductor integrated circuit and the second alignment mark structure of the second semiconductor integrated circuit to obtain a deviation value and adjusting a relative position of the first semiconductor integrated circuit and the second semiconductor integrated circuit according to the deviation value; bonding the first semiconductor integrated circuit to the second semiconductor integrated circuit after the alignment process; performing a verification process to obtain a final verification deviation value after the first semiconductor integrated circuit is bonded to the second semiconductor integrated circuit; determining whether to re-bond the first semiconductor integrated circuit and the second semiconductor integrated circuit according to the final verification deviation value.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regarded as an illustrative sense rather than a restrictive sense. Moreover, the descriptions disclosed in the embodiments of the disclosure such as detailed construction, manufacturing steps and material selections are for illustration only, not for limiting the scope of the disclosure. The steps and elements in details of the embodiments could be modified or changed according to the actual needs of the practical applications. It is contemplated that the elements and features of one embodiment can be beneficially incorporated in another embodiment without further recitation. The disclosure is not limited to the descriptions of the embodiments. The illustration uses the same/similar symbols to indicate the same/similar elements.

Moreover, use of ordinal terms such as "first", "second", "third", etc., in the specification and claims to modify an element or a step does not by itself imply any priority, precedence, or order of one claim element or step over another, but are used merely as labels to distinguish one claim element or step having a certain name from another element or step having the same name (but for use of the ordinal term) to distinguish the claim elements or steps.

The embodiments of the present disclosure can be implemented in several integrated circuits in the applications. The integrated circuit refers to a structure where electronic circuit(s) integrated on a semiconductor material. For example, the integrated circuit may include wafer(s), die(s) diced from wafer(s), or combinations thereof. In the following description, semiconductor wafers are used as examples to explain the concept of the embodiments; however, the embodiments are readily applicable to other integrated circuits, such as integrated circuits including one or more dies, integrated circuits including at least one die and at least one semiconductor wafer, etc.

Figure 1:
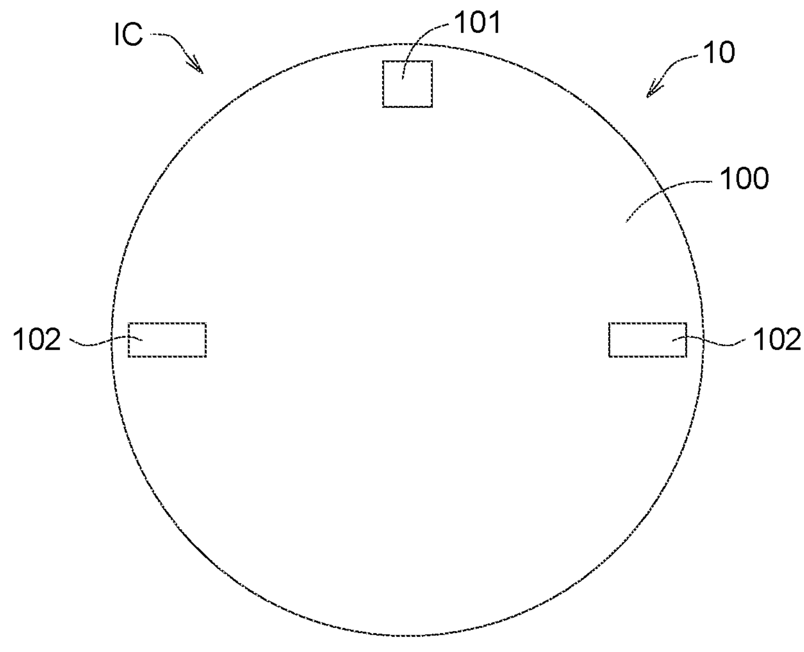
FIG. 1 shows a schematic top view of a semiconductor integrated circuit according to an embodiment of the present disclosure.

Please refer to FIG. 1, which shows a schematic top view of a semiconductor integrated circuit IC according to an embodiment. The semiconductor integrated circuit IC includes a semiconductor wafer 10. The semiconductor wafer 10 includes a substrate 100, at least one overlay mark structure 101 in the substrate 100 and at least one alignment mark structure 102 in the substrate 100. FIG. 1 exemplarily shows one overlay mark structure 101 and two alignment mark structures 102 in the substrate 100, but the present disclosure is not limited thereto. The semiconductor wafer 10 can include any number of overlay mark structures 101 and any number of alignment mark structures 102. The overlay mark structure 101 and the alignment mark structure 102 are in different regions of the semiconductor wafer 10. The overlay mark structure 101 and the alignment mark structure 102 are non-overlapping with each other. The overlay mark structure 101 and the alignment mark structure 102 may be formed on the front side of the semiconductor wafer 10. The substrate 100 may include multi-layer structure including a semiconductor layer an oxide layer and a dielectric layer (e.g. a nitricarbide layer). In an embodiment, the semiconductor wafer 10 includes a circuit area where an active circuitry is formed and a peripheral area where the overlay mark structure 101 and the alignment mark structure 102 are formed.

Figures 2A, 2B:
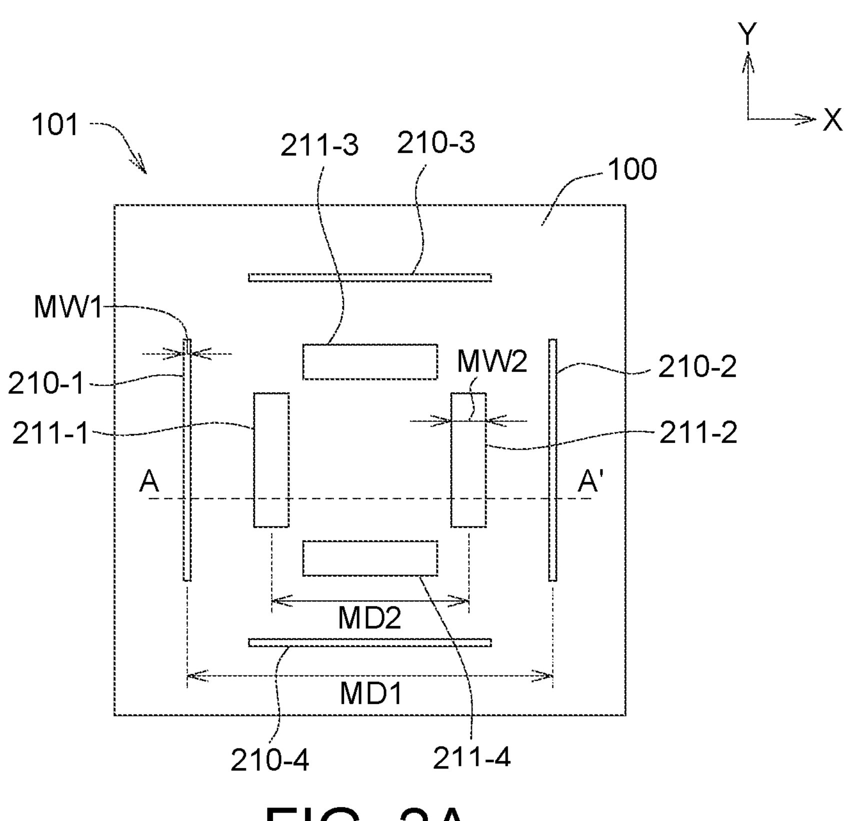
FIG. 2A shows a schematic top view of an overlay mark structure according to an embodiment of the present disclosure.
FIG. 2B shows a cross-sectional view of the overlay mark structure illustrated along the line AA' shown in FIG. 2A.

Please refer to FIGS. 2A-2B, which show a schematic top view of the overlay mark structure 101 and a cross-sectional view of the overlay mark structure 101 illustrated along the line AA' shown in FIG. 2A according to an embodiment. The overlay mark structure 101 includes first overlay marks 210-1~210-4 and second overlay marks 211-1~211-4 separated from each other. The first overlay marks 210-1~210-2 are arranged along the X direction and extend along the Y direction perpendicular to the X direction. The first overlay marks 210-3~210-4 are arranged along the Y direction and extend along the X direction. The second overlay marks 211-1~211-2 are arranged along the X direction and extend along the Y direction. The second overlay marks 211-3~211-4 are arranged along the Y direction and extend along the X direction. The second overlay marks 211-1~211-4 are surrounded by the first overlay marks 210-1~210-4. In this embodiment, a mark distance between adjacent two first overlay marks is larger than a mark distance between adjacent two second overlay marks along the X direction or the Y direction. For example, a mark distance MD1 between adjacent two first overlay marks 210-1 and 210-2 is larger than a mark distance MD2 between adjacent two second overlay marks 211-1 and 211-2 along the X direction.

The first overlay marks 210-1~210-4 are narrower than the second overlay marks 211-1~211-4. Specifically, a mark width of the first overlay mark is smaller than a mark width of the second overlay mark along the X direction or the Y direction. For example, a mark width MW1 of the first overlay mark 210-1 along the X direction is smaller than a mark width MW2 of the second overlay mark 211-2 along the X direction. The first overlay marks 210-1~210-4 and the second overlay marks 211-1~211-4 may be rectangular.

Each of the first overlay marks 210-1~210-4 includes a conductive layer and a barrier layer between the conductive layer and the substrate. For example, as shown in FIG. 2B, the first overlay mark 210-1 includes a conductive layer 252 and a barrier layer 251 between the conductive layer 252 and the substrate 100; the first overlay mark 210-2 includes a conductive layer 254 and a barrier layer 253 between the conductive layer 254 and the substrate 100. The barrier layer 251 is on the sidewall and the bottom of the conductive layer 252. The barrier layer 253 is on the sidewall and the bottom of the conductive layer 254. Each of the second overlay marks 211-1~211-4 includes a conductive layer and a barrier layer between the conductive layer and the substrate. For example, as shown in FIG. 2B, the second overlay mark 211-1 includes a conductive layer 256 and a barrier layer 255 between the conductive layer 256 and the substrate 100; the second overlay mark 211-2 includes a conductive layer 258 and a barrier layer 257 between the conductive layer 258 and the substrate 100. The barrier layer 255 is on the sidewall and the bottom of the conductive layer 256. The barrier layer 257 is on the sidewall and the bottom of the conductive layer 258. The first overlay marks 210-1~210-4 and the second overlay marks 211-1~211-4 are formed in trenches in the substrate 100. In this embodiment, the depth of the trench for the first overlay mark and the depth of the trench for the second overlay mark are the same, but the present disclosure is not limited thereto. The first overlay marks 210-1~210-4 and the second overlay marks 211-1~211-4 are exposed on an upper surface of the substrate 100. The barrier layers 251, 253, 255 and 257 may include Ta, Ti, TaN, TiN or other suitable materials which can avoid or reduce copper diffusion into the substrate 100. The conductive layers 252, 254, 256, 258 include may include metal such as copper.

The overlay mark structure of the present disclosure is not limited to the above-mentioned embodiment, and may have other different embodiments. To simplify the description and for the convenience of comparison between embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
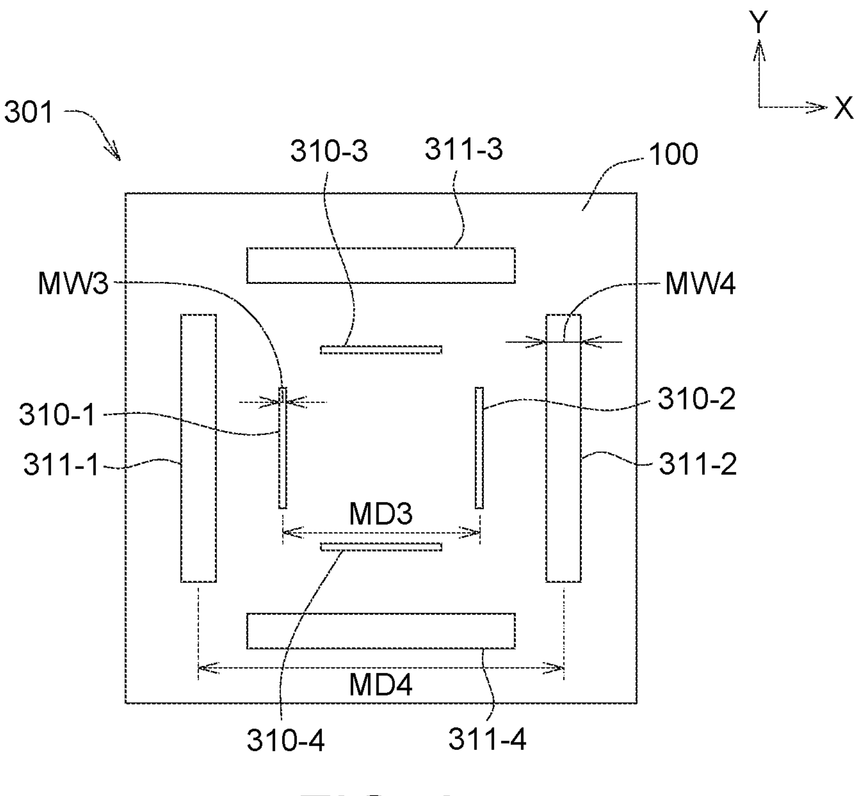
FIGS. 3 to 5 show schematic top views of overlay mark structures according to embodiments of the present disclosure.

Please refer to FIG. 3, which shows a schematic top view of an overlay mark structure 301 according to an embodiment. The overlay mark structure 301 includes first overlay marks 310-1~310-4 and second overlay marks 311-1~311-4 separated from each other. The first overlay marks 310-1~310-2 are arranged along the X direction and extend along the Y direction perpendicular to the X direction. The first overlay marks 310-3~310-4 are arranged along the Y direction and extend along the X direction. The second overlay marks 311-1~311-2 are arranged along the X direction and extend along the Y direction. The second overlay marks 311-3~311-4 are arranged along the Y direction and extend along the X direction. The first overlay marks 310-1~310-4 are surrounded by the second overlay marks 311-1~311-4. In this embodiment, a mark distance between adjacent two first overlay marks is smaller than a mark distance between adjacent two second overlay marks along the X direction or the Y direction. For example, a mark distance MD3 between adjacent two first overlay marks 310-1 and 310-2 is smaller than a mark distance MD4 between adjacent two second overlay marks 311-1 and 311-2 along the X direction.

The first overlay marks 310-1~310-4 are narrower than the second overlay marks 311-1~311-4. Specifically, a mark width of the first overlay mark is smaller than a mark width of the second overlay mark along the X direction or the Y direction. For example, a mark width MW3 of the first overlay mark 310-1 along the X direction is smaller than a mark width MW4 of the second overlay mark 311-2 along the X direction. The first overlay marks 310-1~310-4 and the second overlay marks 311-1~311-4 may be rectangular.

Figure 4:
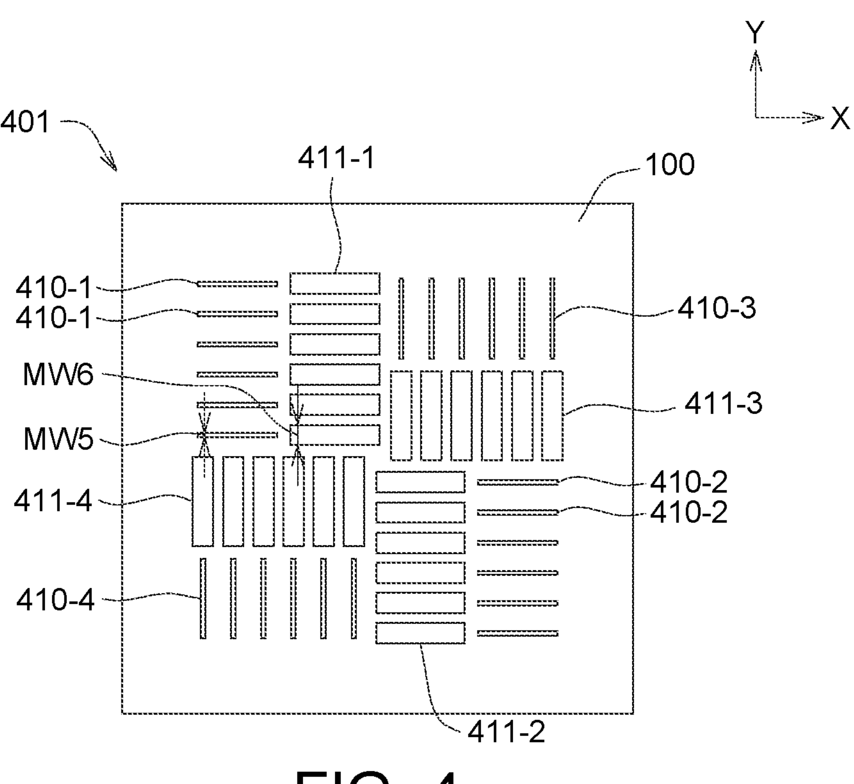

Please refer to FIG. 4, which shows a schematic top view of an overlay mark structure 401 according to an embodiment. The overlay mark structure 401 includes first overlay marks 410-1~410-4 and second overlay marks 411-1~411-4 separated from each other. The first overlay marks 410-1 are arranged along the Y direction and extend along the X direction. The first overlay marks 410-1 may be parallel to each other. The first overlay marks 410-2 are arranged along the Y direction and extend along the X direction. The first overlay marks 410-2 may be parallel to each other. The first overlay marks 410-3 are arranged along the X direction and extend along the Y direction. The first overlay marks 410-3 may be parallel to each other. The first overlay marks 410-4 are arranged along the X direction and extend along the Y direction. The first overlay marks 410-4 may be parallel to each other. The second overlay marks 411-1 are arranged along the Y direction and extend along the X direction. The second overlay marks 411-1 may be parallel to each other. The second overlay marks 411-2 are arranged along the Y direction and extend along the X direction. The second overlay marks 411-2 may be parallel to each other. The second overlay marks 411-3 are arranged along the X direction and extend along the Y direction. The second overlay marks 411-3 may be parallel to each other. The second overlay marks 411-4 are arranged along the X direction and extend along the Y direction. The second overlay marks 411-4 may be parallel to each other.

The second overlay marks 411-1~411-4 are surrounded by the first overlay marks 410-1~410-4. The second overlay marks 411-1 are between the first overlay marks 410-1 and the first overlay marks 410-3 and the second overlay marks 411-3. The second overlay marks 411-1 are between the first overlay marks 410-1 and the first overlay marks 410-2. The second overlay marks 411-2 are between the first overlay marks 410-2 and the first overlay marks 410-4 and the second overlay marks 411-4. The second overlay marks 411-2 are between the first overlay marks 410-2 and the first overlay marks 410-1. The second overlay marks 411-3 are between the first overlay marks 410-2 and the first overlay marks 410-3 and the second overlay marks 411-2. The second overlay marks 411-3 are between the first overlay marks 410-3 and the first overlay marks 410-4. The second overlay marks 411-4 are between the first overlay marks 410-1 and the first overlay marks 410-4 and the second overlay marks 411-1. The second overlay marks 411-4 are between the first overlay marks 410-4 and the first overlay marks 410-3.

The first overlay marks 410-1~410-4 are narrower than the second overlay marks 411-1~411-4. Specifically, a mark width of the first overlay mark is smaller than a mark width of the second overlay mark along the X direction or the Y direction. For example, a mark width MW5 of the first overlay mark 410-1 along the Y direction is smaller than a mark width MW6 of the second overlay mark 411-1 along the Y direction. The first overlay marks 410-1~410-4 and the second overlay marks 411-1~411-4 may be rectangular.

Figure 5:
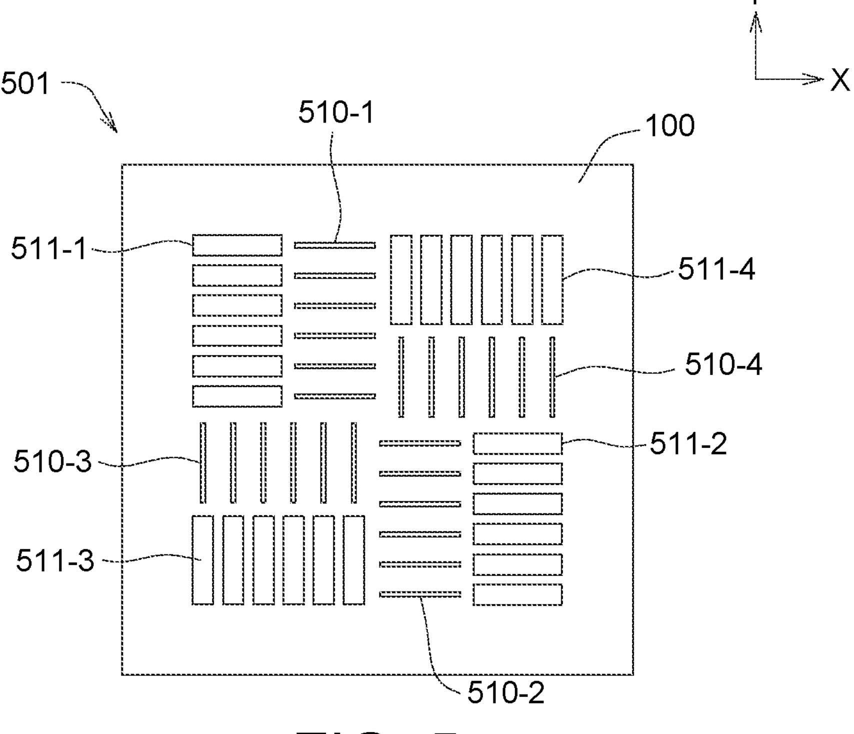

Please refer to FIG. 5, which shows a schematic top view of an overlay mark structure 501 according to an embodiment. The overlay mark structure 501 includes first overlay marks 510-1~510-4 and second overlay marks 511-1~511-4 separated from each other. The first overlay marks 510-1 are arranged along the Y direction and extend along the X direction. The first overlay marks 510-1 may be parallel to each other. The first overlay marks 510-2 are arranged along the Y direction and extend along the X direction. The first overlay marks 510-2 may be parallel to each other. The first overlay marks 510-3 are arranged along the X direction and extend along the Y direction. The first overlay marks 510-3 may be parallel to each other. The first overlay marks 510-4 are arranged along the X direction and extend along the Y direction. The first overlay marks 510-4 may be parallel to each other. The second overlay marks 511-1 are arranged along the Y direction and extend along the X direction. The second overlay marks 511-1 may be parallel to each other. The second overlay marks 511-2 are arranged along the Y direction and extend along the X direction. The second overlay marks 511-2 may be parallel to each other. The second overlay marks 511-3 are arranged along the X direction and extend along the Y direction. The second overlay marks 511-3 may be parallel to each other. The second overlay marks 511-4 are arranged along the X direction and extend along the Y direction. The second overlay marks 511-4 may be parallel to each other.

The first overlay marks 510-1~510-4 are surrounded by the second overlay marks 511-1~511-4. The first overlay marks 510-1 are between the second overlay marks 511-1 and the second overlay marks 511-4 and the first overlay marks 510-4. The first overlay marks 510-1 are between the second overlay marks 511-1 and the second overlay marks 511-2. The first overlay marks 510-2 are between the second overlay marks 511-2 and the second overlay marks 511-3 and the first overlay marks 510-3. The first overlay marks 510-2 are between the second overlay marks 511-2 and the second overlay marks 511-1. The first overlay marks 510-3 are between the second overlay marks 511-3 and the second overlay marks 511-1 and the first overlay marks 510-1. The first overlay marks 510-3 are between the second overlay marks 511-3 and the second overlay marks 511-4. The first overlay marks 510-4 are between the second overlay marks 511-4 and the second overlay marks 511-2 and the first overlay marks 510-2. The first overlay marks 510-4 are between the second overlay marks 511-4 and the second overlay marks 511-3.

The first overlay marks 510-1~510-4 are narrower than the second overlay marks 511-1~511-4. Specifically, a mark width of the first overlay mark is smaller than a mark width of the second overlay mark along the X direction or the Y direction. For example, a mark width of the first overlay mark 510-2 along the Y direction is smaller than a mark width of the second overlay mark 511-2 along the Y direction. The first overlay marks 510-1~510-4 and the second overlay marks 511-1~511-4 may be rectangular.

In an embodiment, the overlay mark structure (e.g. the overlay mark structures 101, 301, 401 and 501) and the alignment mark structure (e.g. the alignment mark structure 102) can be used to align semiconductor wafers with each other. The semiconductor wafers can be aligned by an alignment system. The alignment system may include at least one optical equipment. Detection light, such as ultraviolet, visible, infrared radiation, can be provided by the optical equipment to the overlay mark structure and the alignment mark structure of the semiconductor wafer, and the positions of the overlay mark structure and the alignment mark structure can be detected. The position and/or orientation of the semiconductor wafer can be adjusted according to the detection results.

Please refer to FIGS. 6 to 12B, which illustrate a semiconductor device and a method for aligning semiconductor integrated circuits according to embodiments. In the following description, a wafer-to-wafer bonding/alignment is used as examples to explain the concept of the embodiments; however, the embodiments is readily applicable to other bonding/alignments, such as a die-to-wafer bonding/alignment and die-to-die bonding/alignment.

Figure 6:
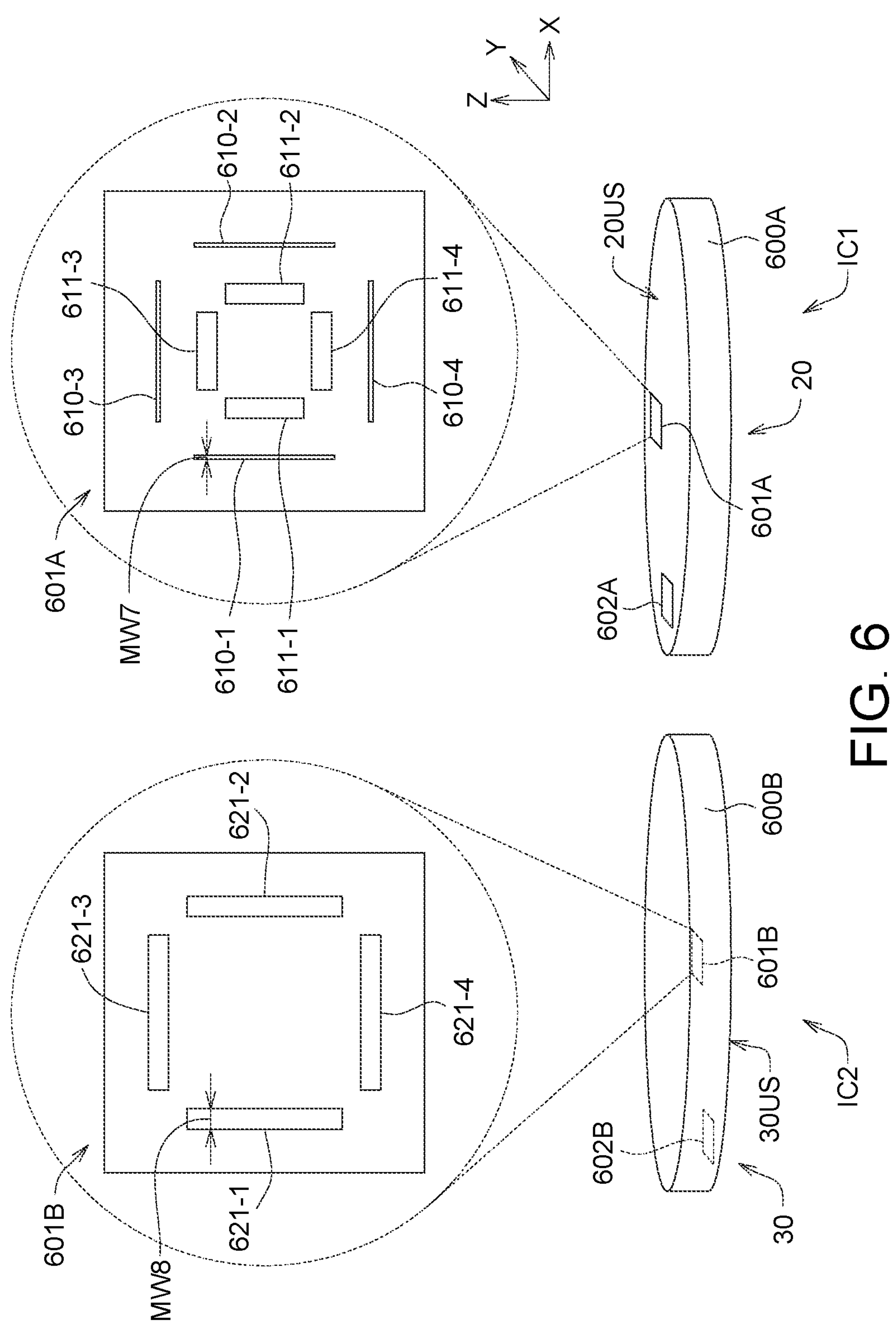
FIGS. 6 to 12B illustrate a semiconductor device and a method for aligning semiconductor integrated circuits according to embodiments of the present disclosure.

As shown in FIG. 6, a semiconductor integrated circuit IC1 including a semiconductor wafer 20 and a semiconductor integrated circuit IC2 including a semiconductor wafer 30 are provided. The semiconductor wafer 20 includes a substrate 600A, an overlay mark structure 601A in the substrate 600A and an alignment mark structure 602A in the substrate 600A. The overlay mark structure 601A and the alignment mark structure 602A are formed on the front side 20US of the semiconductor wafer 20. The overlay mark structure 601A and the alignment mark structure 602A are in different regions of the semiconductor wafer 20. The overlay mark structure 601A includes first overlay marks 610-1~610-4 and second overlay marks 611-1~611-4 separated from each other. The arrangement of the first overlay marks 610-1~610-4 and the second overlay marks 611-1~611-4 (e.g. relative positional relationship between the first overlay marks 610-1~610-4 and the second overlay marks 611-1~611-4) is similar to the overlay mark structure 101 shown in FIG. 2A, and the specific features of them will not be redundantly described here.

The semiconductor wafer 30 includes a substrate 600B, an overlay mark structure 601B in the substrate 600B and an alignment mark structure 602B in the substrate 600B. The overlay mark structure 601B and the alignment mark structure 602B are formed on the front side 30US of the semiconductor wafer 30. The overlay mark structure 601B and the alignment mark structure 602B are in different regions of the semiconductor wafer 30. The overlay mark structure 601B includes third overlay marks 621-1~621-4. The third overlay marks 621-1~621-4 are arranged in positions that can correspond to the first overlay marks 610-1~610-4 respectively. In this embodiment, the third overlay marks 621-1~621-2 are arranged along the X direction and extend along the Y direction. The third overlay marks 621-3~621-4 are arranged along the Y direction and extend along the X direction. The third overlay marks 621-1~621-4 are wider than the first overlay marks 610-1~610-4. A mark width of the first overlay mark is smaller than a mark width of the third overlay mark along the X direction or the Y direction. For example, a mark width MW7 of the first overlay mark 610-1 along the X direction is smaller than a mark width MW8 of the third overlay mark 621-1 along the X direction. A length of the third overlay marks 621-1~621-4 may be larger than or equal to a length of the first overlay marks 610-1~610-4. The third overlay marks 610-1~610-4 may be rectangular. In an embodiment, the semiconductor wafer 20 and the semiconductor wafer 30 are formed through the front-end process. Surface treatment processes are performed to the semiconductor wafer 20 and the semiconductor wafer 30. The surface treatment processes may include clean processes and planarization processes for planarizing surfaces to be bonded of the semiconductor wafer 20 and the semiconductor wafer 30 (such as the front side 20US of the semiconductor wafer 20 and the front side 30US of the semiconductor wafer 30). For example, the planarization processes are chemical-mechanical planarization (CMP) processes.

Figure 7:
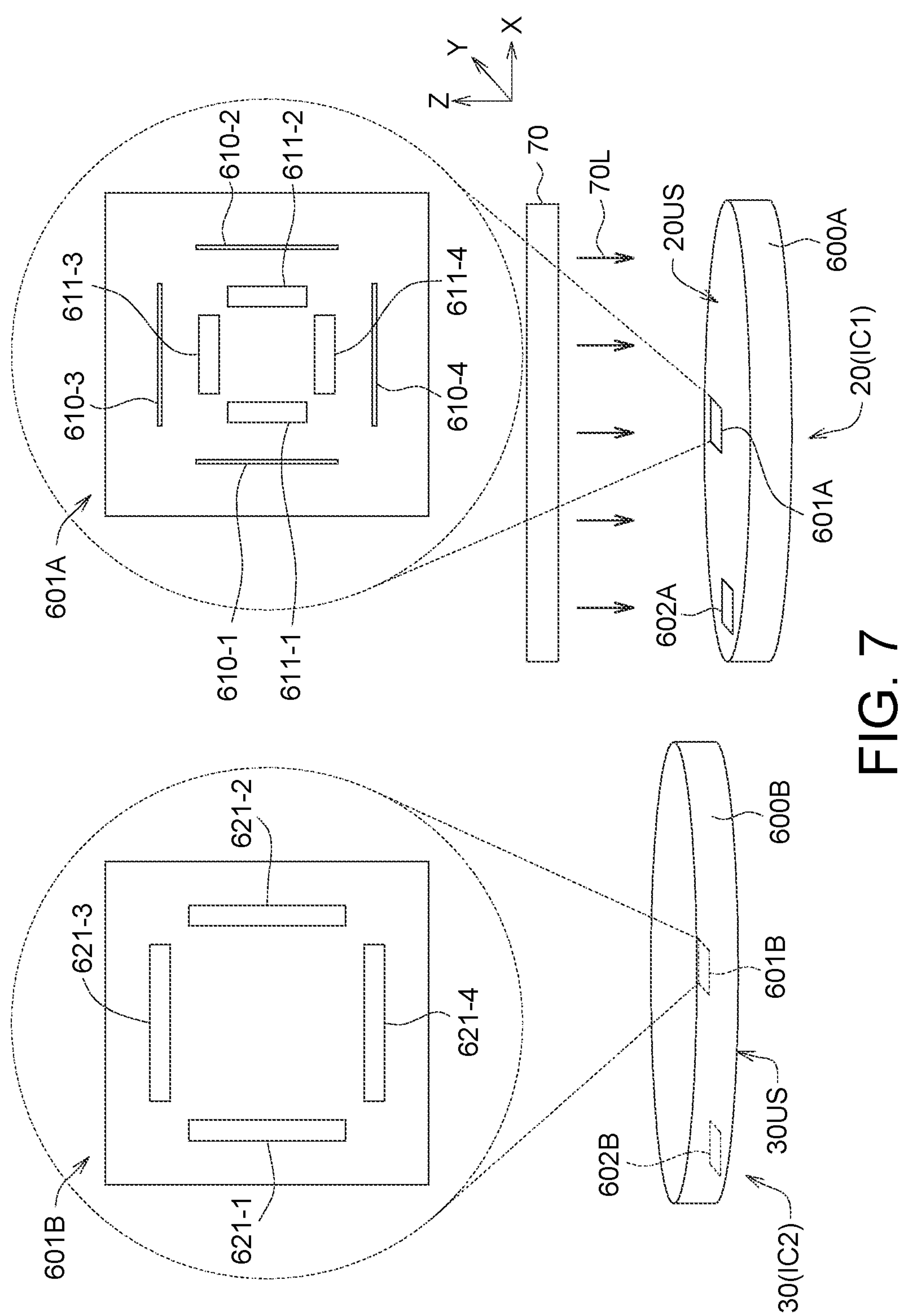

As shown in FIG. 7, a measurement process is performed to the semiconductor wafer 20 of the semiconductor integrated circuit IC1 after the surface treatment processes. The measurement process includes using light 70L provided by an optical equipment 70 to detect the first overlay marks 610-1~610-4 and the second overlay marks 611-1~611-4 of the overlay mark structure 601A of the semiconductor wafer 20 to obtain an offset value. The offset value can be understood as a non-zero offset because the planarization processes of the surface treatment processes cause structural asymmetry of the second overlay marks 611-1~611-4. In an embodiment, the wavelength of the light 70L can be between 300~900 nm or between 400~840 nm. In an embodiment, the measurement process is only performed on the semiconductor wafer 20 and not on the semiconductor wafer 30.

Figures 8, 9:
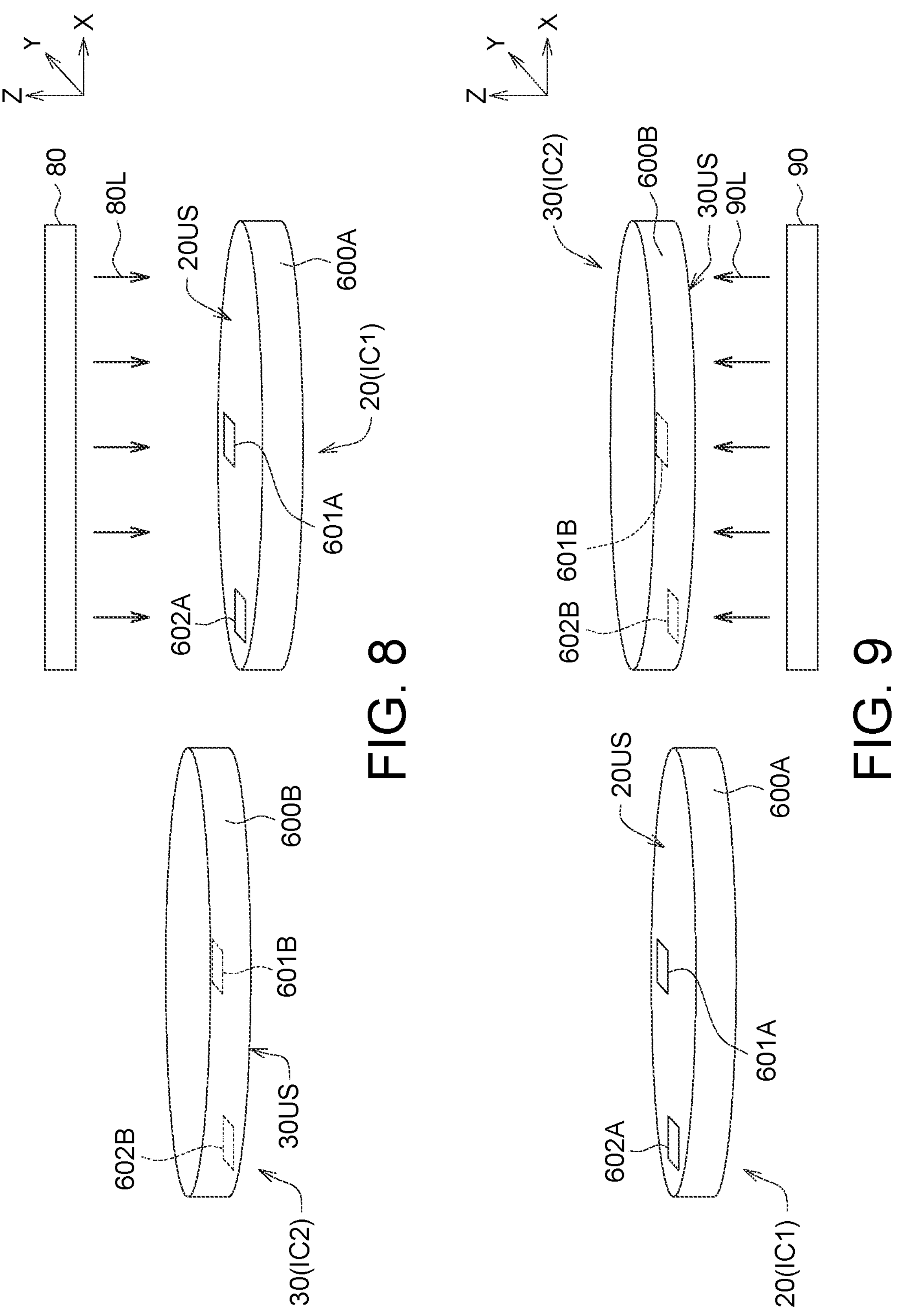

As shown in FIGS. 8-9, an alignment process is performed to adjusting the position and/or the orientation of the semiconductor wafer 20 of the semiconductor integrated circuit IC1 and adjusting the position and/or the orientation of the semiconductor wafer 30 of the semiconductor integrated circuit IC2. The alignment process is performed before the semiconductor wafer 20 is bonded to the semiconductor wafer 30. The alignment process includes using light 80L provided by an optical equipment 80 to detect the alignment mark structure 602A of the semiconductor wafer 20 and using light 90L provided by an optical equipment 90 to detect the alignment mark structure 602B of the semiconductor wafer 30 to obtain a deviation value, and then adjusting a relative position and/or a relative orientation of the semiconductor wafer 20 and the semiconductor wafer 30 according to the deviation value by the alignment system. The light 80L is directed to the front side 20US of the semiconductor wafer 20. The light 90L is directed to the front side 30US of the semiconductor wafer 30. The optical equipment 80 and the optical equipment 90 can be included in a bonding equipment such as bonder. The light 80L and the light 90L may be visible radiation such as white light. In an embodiment, the wavelength of the light 80L is between the ranges of 400~700 nm. In an embodiment, the wavelength of the light 90L is between the ranges of 400~700 nm. The alignment mark structure 602A of the semiconductor wafer 20 and the alignment mark structure 602B of the semiconductor wafer 30 may be detected sequentially, or alternatively, the alignment mark structure 602A of the semiconductor wafer 20 and the alignment mark structure 602B of the semiconductor wafer 30 may be detected simultaneously.

Figure 10:
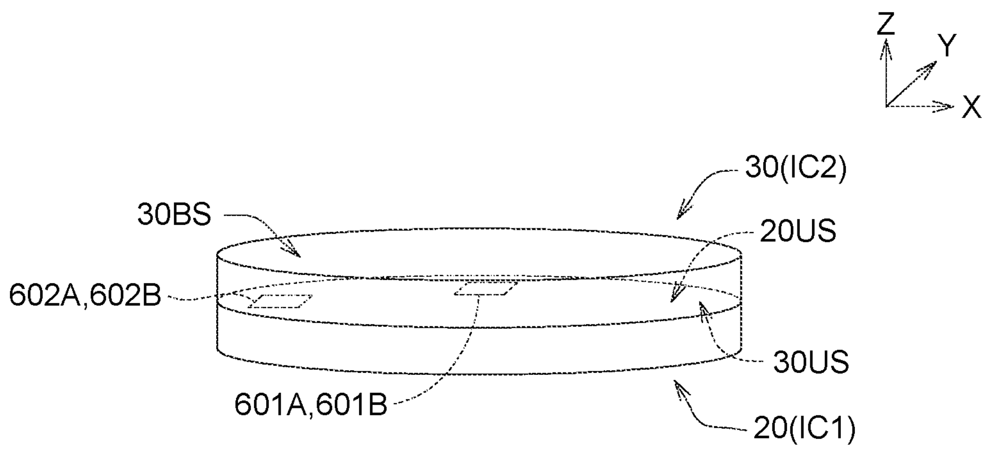

As shown in FIG. 10, the semiconductor wafer 20 of the semiconductor integrated circuit IC1 is bonded to the semiconductor wafer 30 of the semiconductor integrated circuit IC2 through the bonding equipment after the alignment process shown in FIGS. 8-9. Specifically, the semiconductor wafer 20 is temporarily bonded to the semiconductor wafer 30 at room temperature. The front side 20US of the semiconductor wafer 20 faces the front side 30US of the semiconductor wafer 30 when the semiconductor wafer 20 is bonded to the semiconductor wafer 30. The front side 20US of the semiconductor wafer 20 may directly contact the front side 30US of the semiconductor wafer 30 when the semiconductor wafer 20 is bonded to the semiconductor wafer 30. The bonding between the semiconductor wafer 20 and the semiconductor wafer 30 can be understood as a hybrid bonding.

Figure 11:
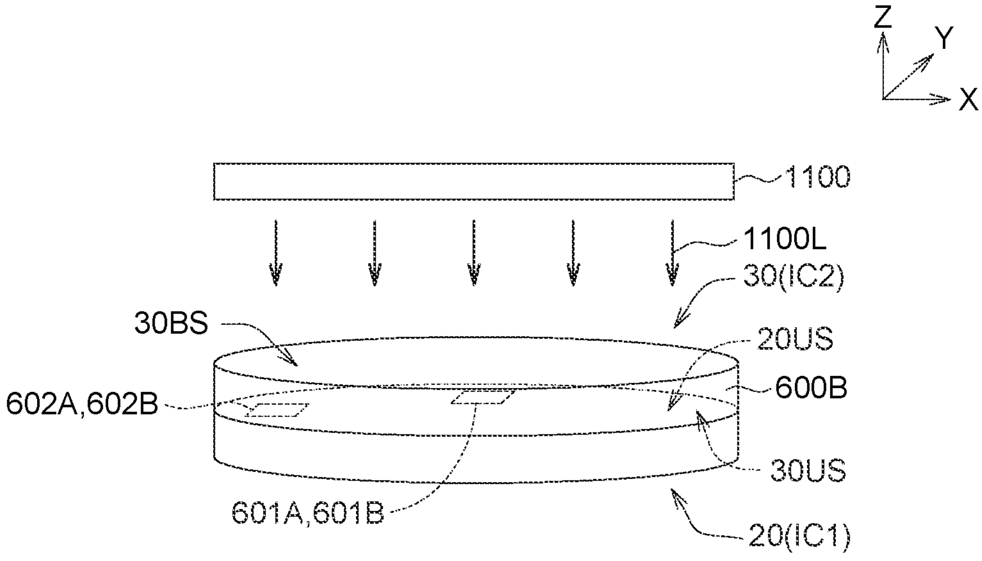

As shown in FIG. 11, a verification process is performed to check the position and/or the orientation of the semiconductor wafer 20 and the position and/or the orientation of the semiconductor wafer 30 after the semiconductor wafer 20 of the semiconductor integrated circuit IC1 is temporarily bonded to the semiconductor wafer 30 of the semiconductor integrated circuit IC2. The verification process includes using light 1100L provided by an optical equipment 1100 to detect the overlay mark structure 601A of the semiconductor wafer 20 and the overlay mark structure 601B of the semiconductor wafer 30 to obtain an initial verification deviation value. The verification process includes using the offset value obtain in the measurement process to correct the initial verification deviation value to obtain a final verification deviation value. The verification process includes determining whether to re-bond the semiconductor wafer 20 and the semiconductor wafer 30 according to the final verification deviation value. When the final verification deviation value exceeds the allowable range (i.e. there is a misalignment between the semiconductor wafer 20 and the semiconductor wafer 30), the semiconductor wafer 20 and the semiconductor wafer 30 will be separated and then the steps shown in FIGS. 8-11 including the alignment process, the step of temporary bonding, and the verification process will be performed again until the final verification deviation value falls within the allowable range. In an embodiment, when the final verification deviation value exceeds the allowable range, the verification process includes transmitting the final verification deviation value to the bonding equipment so as to improve the overlay accuracy. The light 1100L is directed to a back side 30BS of the semiconductor wafer 30 opposite to the front side 30US of the semiconductor wafer 30. The light 1100L passes through the substrate 600B of the semiconductor wafer 30 to detect the overlay mark structure 601A of the semiconductor wafer 20 and the overlay mark structure 601B of the second semiconductor wafer 30. The light 1100L may be infrared light. In an embodiment, the light 1100L is far infrared radiation. In an embodiment, the wavelength of the light 1100L is about 1100 nm. The wavelength of the light 70L used in the measurement process is smaller than the wavelength of the light 1100L used in the verification process.

Figure 12A:
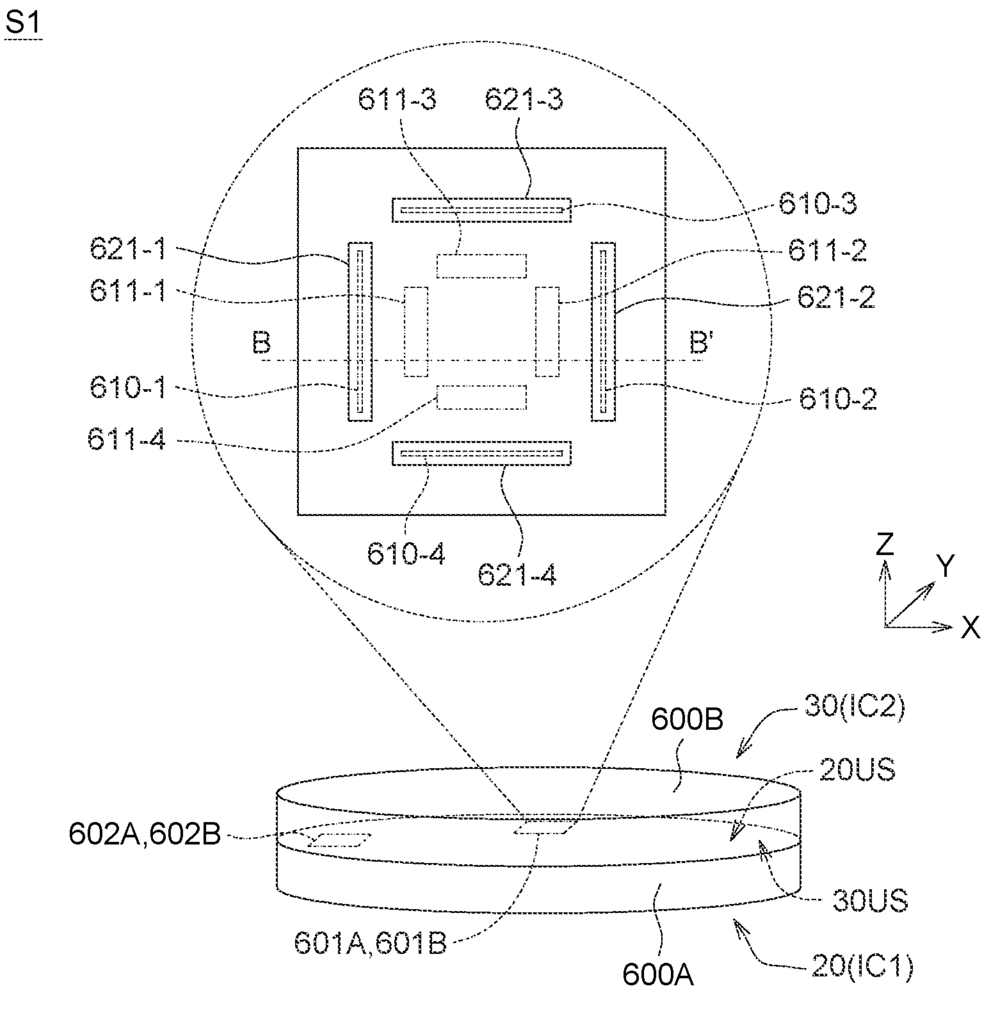
Figure 12B:
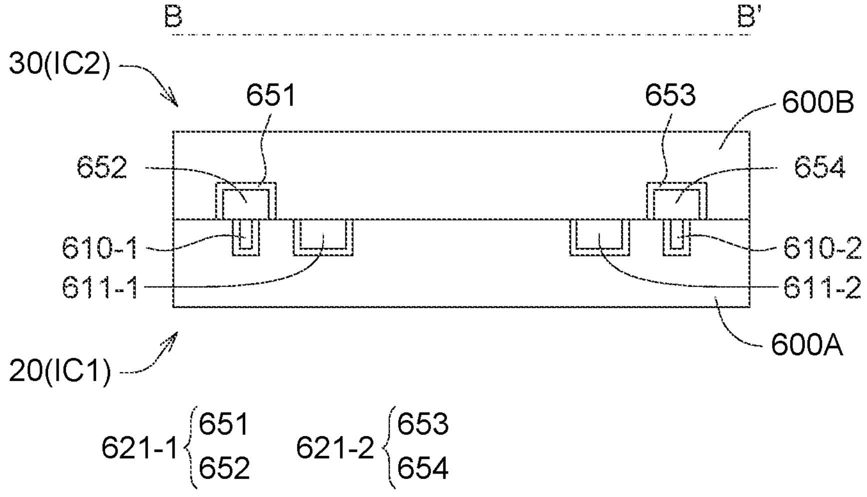

When the final verification deviation value obtained in the verification process is in the allowable range (i.e. there is no misalignment between the semiconductor wafer 20 and the semiconductor wafer 30), an annealing process will be performed to the semiconductor wafer 20 and the semiconductor wafer 30 to strengthen the bonding between the semiconductor wafer 20 and the semiconductor wafer 30 and form a semiconductor device S1 as shown in FIGS. 12A-12B. FIG. 12A shows a schematic view of the semiconductor device S1 and a schematic top view of the overlay mark structures 601A and 601B. FIG. 12B shows a cross-sectional view of the overlay mark structures 601A and 601B illustrated along the line BB' of FIG. 12A. In the semiconductor device S1, the semiconductor wafer 30 is disposed on the semiconductor wafer 20 along the Z direction. The Z direction is perpendicular to the X direction and the Y direction. The semiconductor wafer 20 is bonded to the semiconductor wafer 30 in a face-to-face manner. The overlay mark structure 601B of the semiconductor wafer 30 at least partially overlaps the overlay mark structure 601A of the semiconductor wafer 20. Specifically, the third overlay mark 621-1 of the overlay mark structure 601B of the semiconductor wafer 30 at least partially overlaps the first overlay mark 610-1 of the overlay mark structure 601A of the semiconductor wafer 20 along the Z direction; the third overlay mark 621-2 of the overlay mark structure 601B of the semiconductor wafer 30 at least partially overlaps the first overlay mark 610-2 of the overlay mark structure 601A of the semiconductor wafer 20 along the Z direction; the third overlay mark 621-3 of the overlay mark structure 601B of the semiconductor wafer 30 at least partially overlaps the first overlay mark 610-3 of the overlay mark structure 601A of the semiconductor wafer 20 along the Z direction; the third overlay mark 621-4 of the overlay mark structure 601B of the semiconductor wafer 30 at least partially overlaps the first overlay mark 610-4 of the overlay mark structure 601A of the semiconductor wafer 20 along the Z direction. The first overlay marks 610-1~610-4 of the overlay mark structure 601A of the semiconductor wafer 20 may directly contact the third overlay marks 621-1~621-4 of the overlay mark structure 601B of the semiconductor wafer 30. The second overlay marks 611-1~611-4 of the overlay mark structure 601A of the semiconductor wafer 20 may directly contact the substrate 600B of the semiconductor wafer 30. The third overlay marks 621-1~621-4 of the overlay mark structure 601B of the semiconductor wafer 30 may directly contact the first overlay marks 610-1~610-4 of the overlay mark structure 601A of the semiconductor wafer 20 and the substrate 600A of the semiconductor wafer 20.

Each of the third overlay marks 621-1~621-4 of the overlay mark structure 601B of the semiconductor wafer 30 includes a conductive layer and a barrier layer between the conductive layer and the substrate 600B. For example, as shown in FIG. 12B, the overlay mark 621-1 includes a conductive layer 652 and a barrier layer 651 between the conductive layer 652 and the substrate 600B, and the overlay mark 621-2 includes a conductive layer 654 and a barrier layer 653 between the conductive layer 654 and the substrate 600B. The barrier layer 651 is on the sidewall and the bottom of the conductive layer 652. The barrier layer 653 is on the sidewall and the bottom of the conductive layer 654. In an embodiment, the measurement process, the alignment process and the verification process are performed in a back-end process.

The semiconductor device of the present disclosure is not limited to the above-mentioned embodiment, and may have other different embodiments. To simplify the description and for the convenience of comparison between embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 13A:
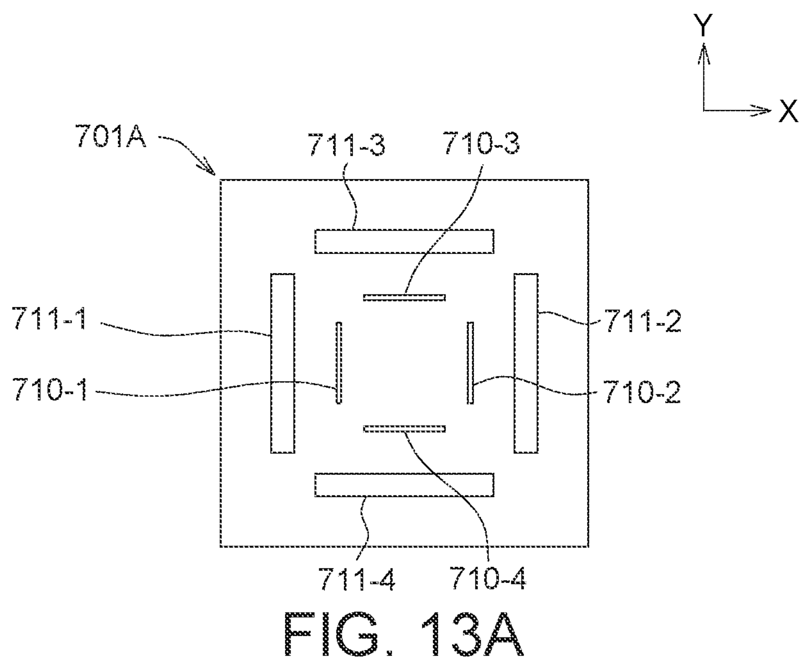
FIGS. 13A to 13B show schematic top views of overlay mark structures according to an embodiment of the present disclosure.
Figure 13B:
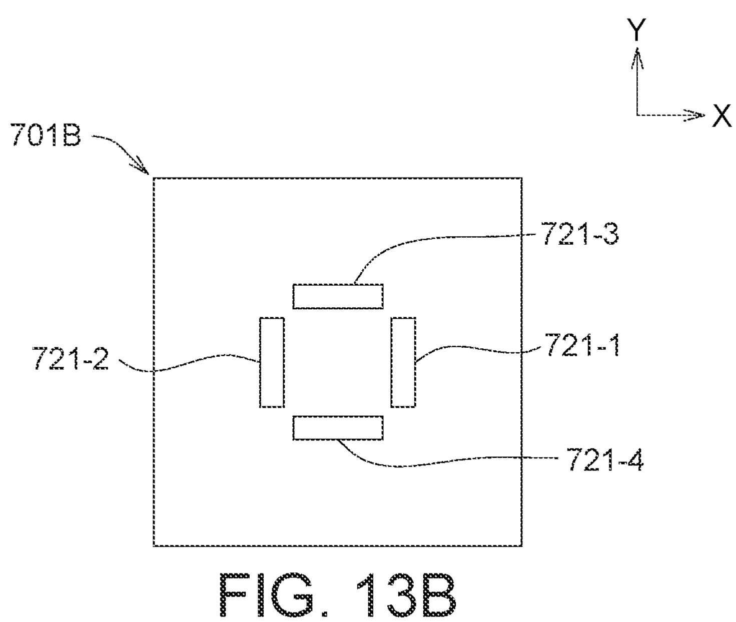
Figure 13C:
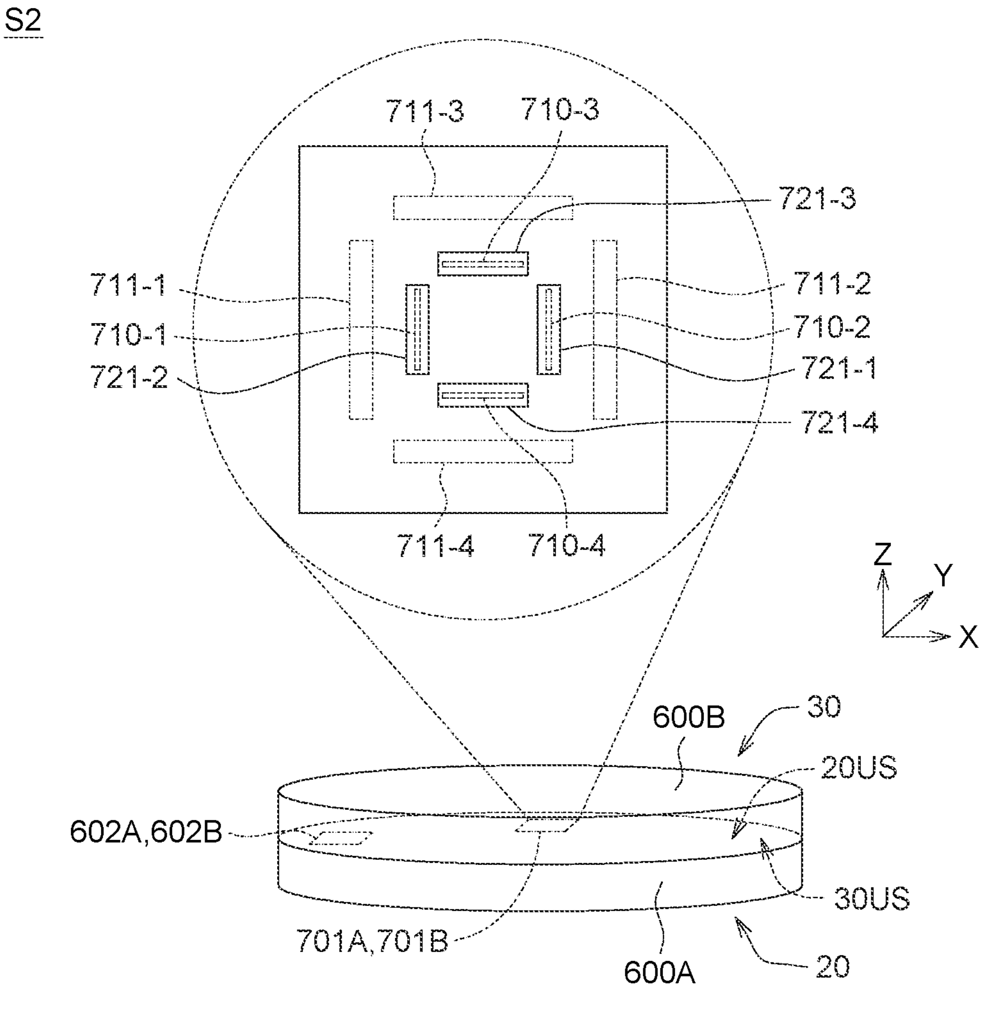
FIG. 13C shows a schematic view of a semiconductor device according to an embodiment of the present disclosure.

Please refer to FIGS. 13A and 13B, which show schematic top views of overlay mark structures 701A and 701B according to an embodiment of the present disclosure. The overlay mark structure 601A of the semiconductor wafer 20 shown in FIG. 6 may be replaced with the overlay mark structures 701A shown in FIG. 13A, and the overlay mark structure 601B of the semiconductor wafer 30 shown in FIG. 6 may be replaced with the overlay mark structures 701B shown in FIG. 13B. A semiconductor device S2 including the overlay mark structures 701A and 701B is provided through the method schematically illustrated in FIGS. 6-12B. FIG. 13C shows a schematic view of the semiconductor device S2 and a schematic top view of the overlay mark structures 701A and 701B.

The overlay mark structure 701A includes first overlay marks 710-1~710-4 and second overlay marks 711-1~711-4 separated from each other. The arrangement of the first overlay marks 710-1~710-4 and the second overlay marks 711-1~711-4 (e.g. relative positional relationship between the first overlay marks 710-1~710-4 and the second overlay marks 711-1~711-4) is similar to the overlay mark structure 301 shown in FIG. 3, and the specific features of them will not be redundantly described here. The overlay mark structure 701B includes third overlay marks 721-1~721-4. The third overlay marks 721-1~721-4 are arranged in positions that can correspond to the first overlay marks 710-1~710-4 respectively. In this embodiment, the third overlay marks 721-1~721-2 are arranged along the X direction and extend along the Y direction. The third overlay marks 721-3~721-4 are arranged along the Y direction and extend along the X direction. The third overlay marks 721-1~721-4 are wider than the first overlay marks 710-1~710-4. A mark width of the first overlay mark is smaller than a mark width of the third overlay mark along the X direction or the Y direction. A length of the third overlay marks 721-1~721-4 may be larger than or equal to a length of the first overlay marks 710-1~710-4. The third overlay marks 721-1~721-4 may be rectangular. Each of the third overlay marks 721-1~721-4 includes a conductive layer and a barrier layer between the conductive layer and the substrate. The arrangements of the conductive layers and the barrier layers of the third overlay marks 721-1~721-4 may be similar to that of the third overlay marks 621-1~621-4.

In the semiconductor device S2, the overlay mark structure 701B of the semiconductor wafer 30 at least partially overlaps the overlay mark structure 701A of the semiconductor wafer 20. The third overlay mark 721-1 of the overlay mark structure 701B of the semiconductor wafer 30 at least partially overlaps the first overlay mark 710-2 of the overlay mark structure 701A of the semiconductor wafer 20 along the Z direction; the third overlay mark 721-2 of the overlay mark structure 701B of the semiconductor wafer 30 at least partially overlaps the first overlay mark 710-1 of the overlay mark structure 701A of the semiconductor wafer 20 along the Z direction; the third overlay mark 721-3 of the overlay mark structure 701B of the semiconductor wafer 30 at least partially overlaps the first overlay mark 710-3 of the overlay mark structure 701A of the semiconductor wafer 20 along the Z direction; the third overlay mark 721-4 of the overlay mark structure 701B of the semiconductor wafer 30 at least partially overlaps the first overlay mark 710-4 of the overlay mark structure 701A of the semiconductor wafer 20 along the Z direction. The first overlay marks 710-1~710-4 of the overlay mark structure 701A of the semiconductor wafer 20 may directly contact the third overlay marks 721-1~721-4 of the overlay mark structure 701B of the semiconductor wafer 30. The second overlay marks 711-1~711-4 of the overlay mark structure 701A of the semiconductor wafer 20 may directly contact the substrate 600B of the semiconductor wafer 30. The third overlay marks 721-1~721-4 of the overlay mark structure 701B of the semiconductor wafer 30 may directly contact the first overlay marks 710-1~710-4 of the overlay mark structure 701A of the semiconductor wafer 20 and the substrate 600A of the semiconductor wafer 20.

Figure 14A:
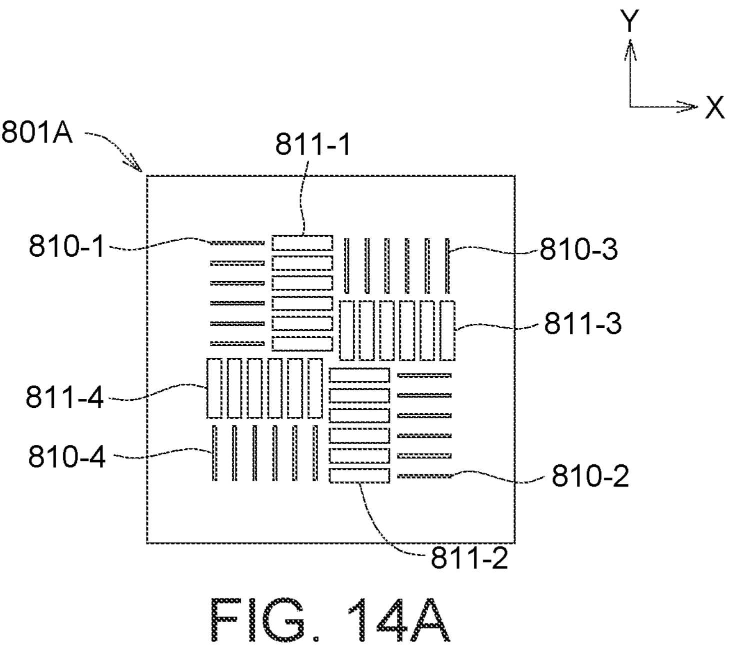
FIGS. 14A to 14B show schematic top views of overlay mark structures according to an embodiment of the present disclosure.
Figure 14B:
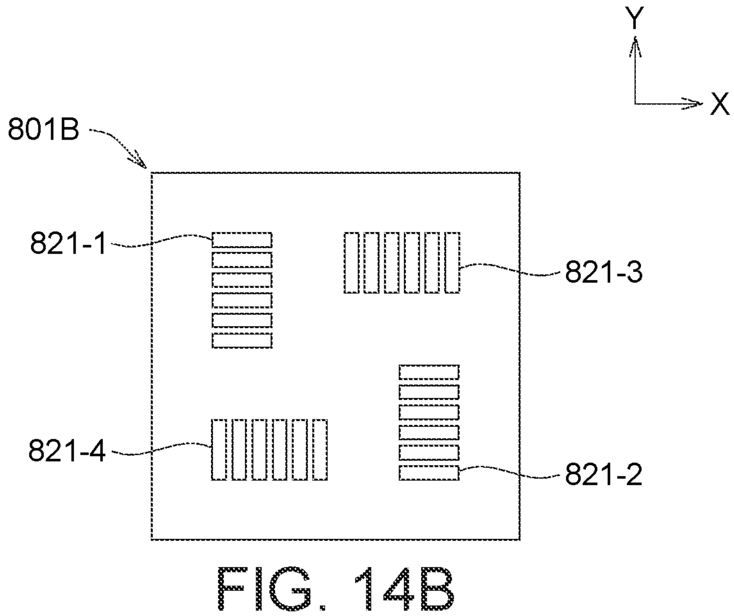
Figure 14C:
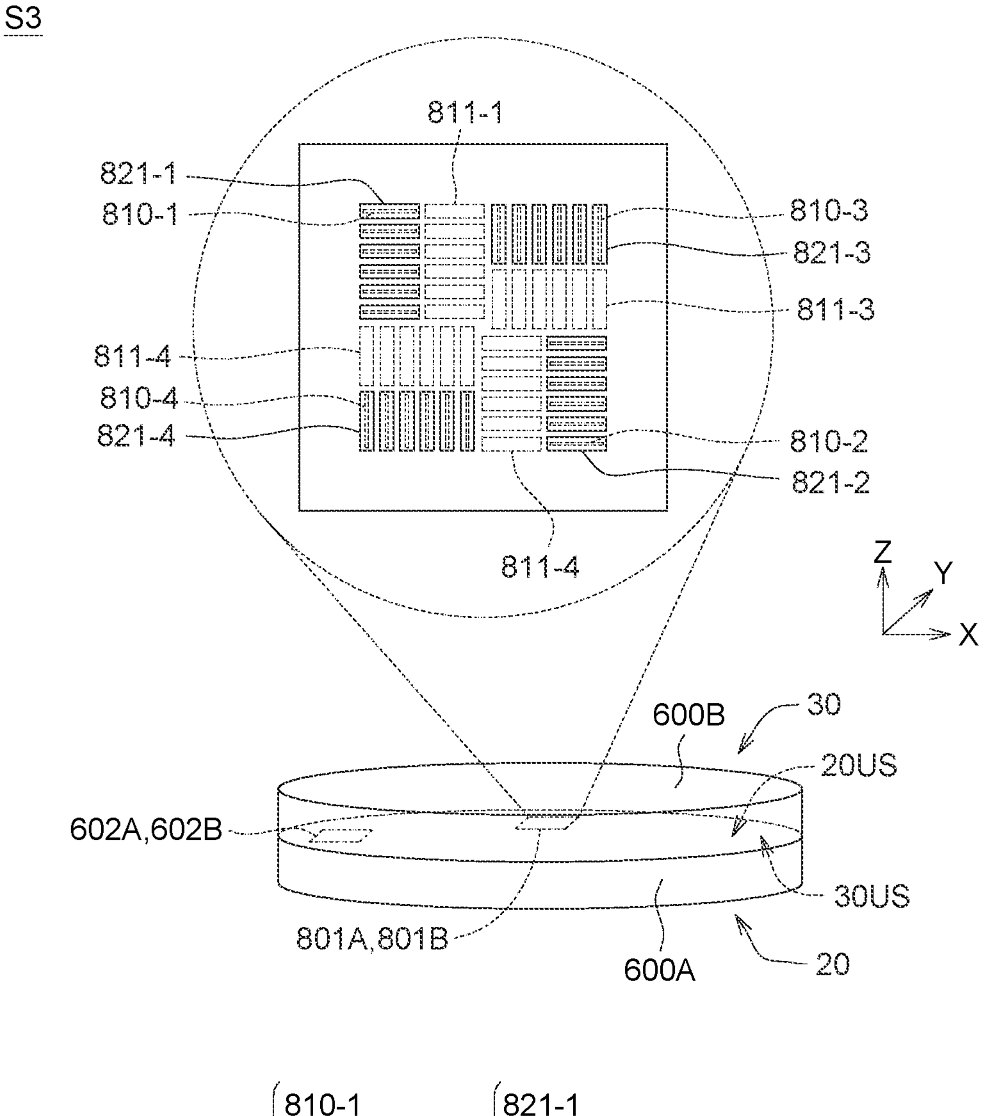
FIG. 14C shows a schematic view of a semiconductor device according to an embodiment of the present disclosure.

Please refer to FIGS. 14A and 14B, which show schematic top views of overlay mark structures 801A and 801B according to an embodiment of the present disclosure. The overlay mark structure 601A of the semiconductor wafer 20 shown in FIG. 6 may be replaced with the overlay mark structures 801A shown in FIG. 14A, and the overlay mark structure 601B of the semiconductor wafer 30 shown in FIG. 6 may be replaced with the overlay mark structures 801B shown in FIG. 14B. A semiconductor device S3 including the overlay mark structures 801A and 801B is provided through the method schematically illustrated in FIGS. 6-12B. FIG. 14C shows a schematic view of the semiconductor device S3 and a schematic top view of the overlay mark structures 801A and 801B.

The overlay mark structure 801A includes first overlay marks 810-1~810-4 and second overlay marks 811-1~811-4 separated from each other. The arrangement of the first overlay marks 810-1~810-4 and the second overlay marks 811-1~811-4 (e.g. relative positional relationship between the first overlay marks 810-1~810-4 and the second overlay marks 811-1~811-4) is similar to the overlay mark structure 401 shown in FIG. 4, and the specific features of them will not be redundantly described here. The overlay mark structure 801B includes third overlay marks 821-1~821-4. The third overlay marks 821-1~821-4 are arranged in positions that can correspond to the first overlay marks 810-1~810-4 respectively. In this embodiment, the third overlay marks 821-1 are arranged along the Y direction and extend along the X direction, and the third overlay marks 821-2 are arranged along the Y direction and extend along the X direction. The third overlay marks 821-3 are arranged along the X direction and extend along the Y direction. The third overlay marks 821-4 are arranged along the X direction and extend along the Y direction. The third overlay marks 821-1~821-4 are wider than the first overlay marks 810-1~810-4. A mark width of the first overlay mark is smaller than a mark width of the third overlay mark along the X direction or the Y direction. A length of the third overlay marks 821-1~821-4 may be larger than or equal to a length of the first overlay marks 810-1~810-4. The third overlay marks 821-1~821-4 may be rectangular. Each of the third overlay marks 821-1~821-4 includes a conductive layer and a barrier layer between the conductive layer and the substrate. The arrangements of the conductive layers and the barrier layers of the third overlay marks 821-1~821-4 may be similar to that of the third overlay marks 621-1~621-4.

In the semiconductor device S3, the overlay mark structure 801B of the semiconductor wafer 30 at least partially overlaps the overlay mark structure 801A of the semiconductor wafer 20. The third overlay marks 821-1 of the overlay mark structure 801B of the semiconductor wafer 30 at least partially overlap the first overlay marks 810-1 of the overlay mark structure 801A of the semiconductor wafer 20 along the Z direction; the third overlay marks 821-2 of the overlay mark structure 801B of the semiconductor wafer 30 at least partially overlaps the first overlay marks 810-2 of the overlay mark structure 801A of the semiconductor wafer 20 along the Z direction; the third overlay marks 821-3 of the overlay mark structure 801B of the semiconductor wafer 30 at least partially overlaps the first overlay mark 810-3 of the overlay mark structure 801A of the semiconductor wafer 20 along the Z direction; the third overlay mark 821-4 of the overlay mark structure 801B of the semiconductor wafer 30 at least partially overlaps the first overlay mark 810-4 of the overlay mark structure 801A of the semiconductor wafer 20 along the Z direction. The first overlay marks 810-1~810-4 of the overlay mark structure 801A of the semiconductor wafer 20 may directly contact the third overlay marks 821-1~821-4 of the overlay mark structure 801B of the semiconductor wafer 30. The second overlay marks 811-1~811-4 of the overlay mark structure 801A of the semiconductor wafer 20 may directly contact the substrate 600B of the semiconductor wafer 30. The third overlay marks 821-1~821-4 of the overlay mark structure 801B of the semiconductor wafer 30 may directly contact the first overlay marks 810-1~810-4 of the overlay mark structure 801A of the semiconductor wafer 20 and the substrate 600A of the semiconductor wafer 20.

Figure 15A:
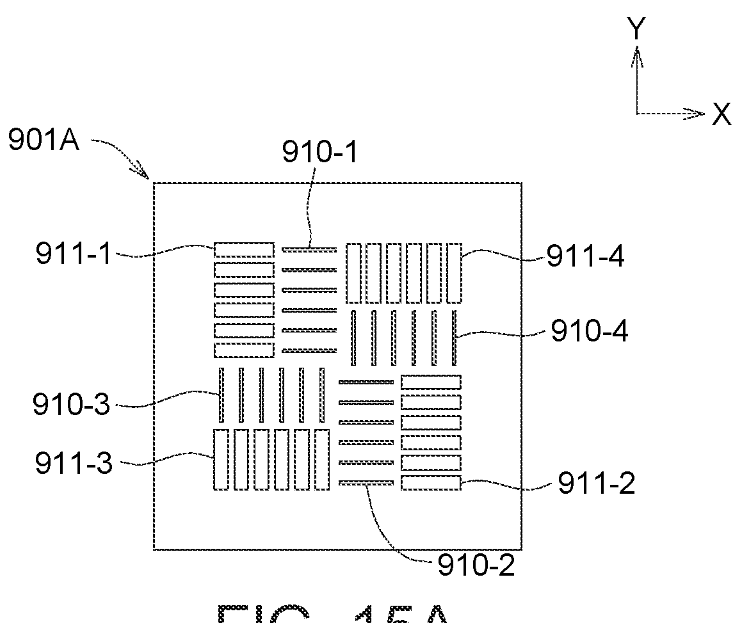
FIGS. 15A to 15B show schematic top views of overlay mark structures according to an embodiment of the present disclosure.
Figure 15B:
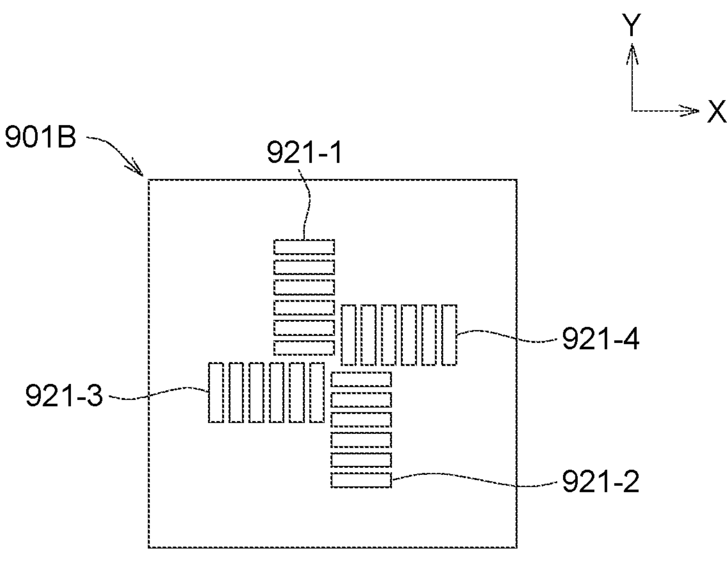
Figure 15C:
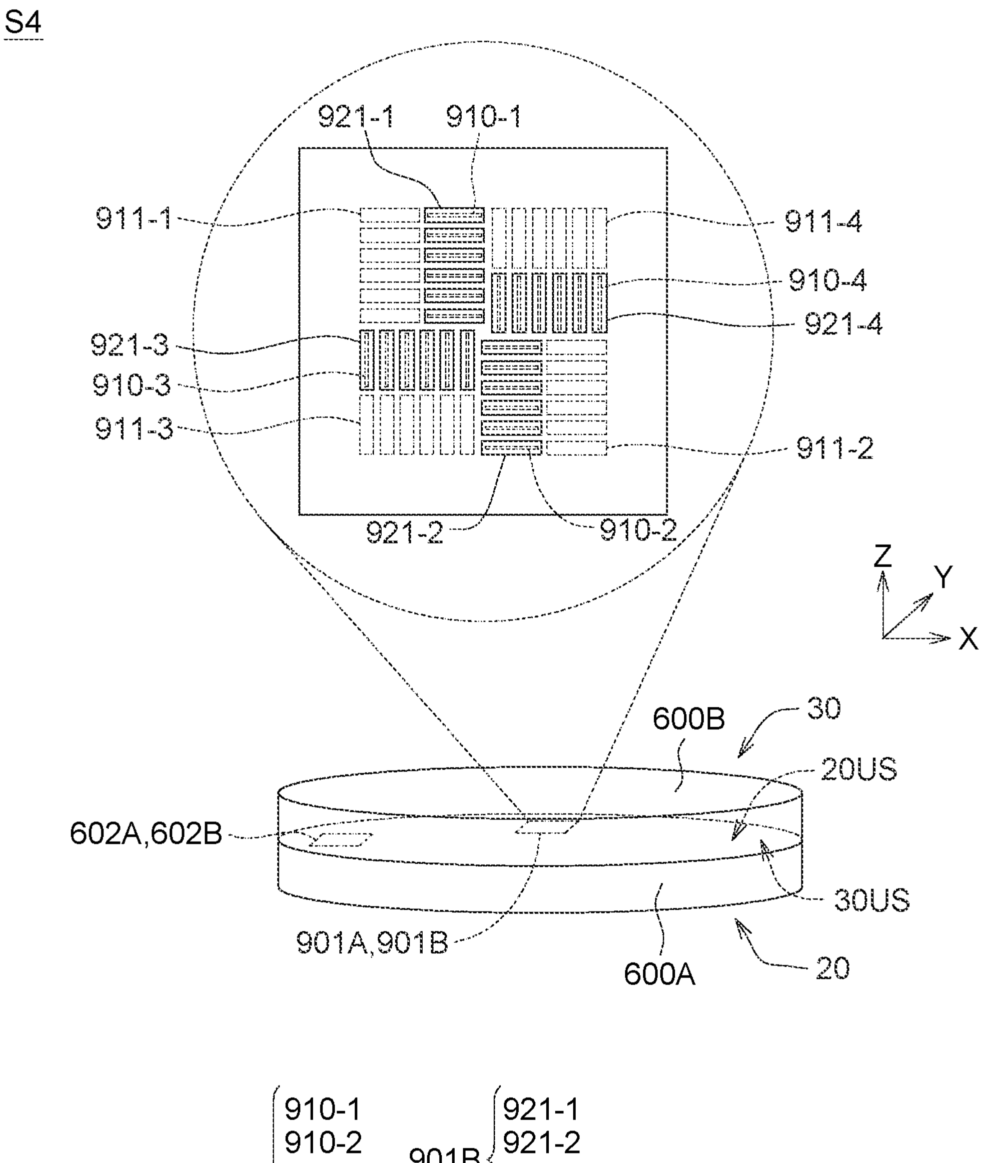
FIG. 15C shows a schematic view of a semiconductor device according to an embodiment of the present disclosure.

Please refer to FIGS. 15A and 15B, which show schematic top views of overlay mark structures 901A and 901B according to an embodiment of the present disclosure. The overlay mark structure 601A of the semiconductor wafer 20 shown in FIG. 6 may be replaced with the overlay mark structures 901A shown in FIG. 15A, and the overlay mark structure 601B of the semiconductor wafer 30 shown in FIG. 6 may be replaced with the overlay mark structures 901B shown in FIG. 15B. A semiconductor device S4 including the overlay mark structures 901A and 901B is provided through the method schematically illustrated in FIGS. 6-12B. FIG. 15C shows a schematic view of the semiconductor device S4 and a schematic top view of the overlay mark structures 901A and 901B.

The overlay mark structure 901A includes first overlay marks 910-1~910-4 and second overlay marks 911-1~911-4 separated from each other. The arrangement of the first overlay marks 910-1~910-4 and the second overlay marks 911-1~911-4 (e.g. relative positional relationship between the first overlay marks 910-1~910-4 and the second overlay marks 911-1~911-4) is similar to the overlay mark structure 501 shown in FIG. 5, and the specific features of them will not be redundantly described here. The overlay mark structure 901B includes third overlay marks 921-1~921-4. The third overlay marks 921-1~921-4 are arranged in positions that can correspond to the first overlay marks 910-1~910-4 respectively. In this embodiment, the third overlay marks 921-1 are arranged along the Y direction and extend along the X direction, and the third overlay marks 921-2 are arranged along the Y direction and extend along the X direction. The third overlay marks 921-3 are arranged along the X direction and extend along the Y direction. The third overlay marks 921-4 are arranged along the X direction and extend along the Y direction. The third overlay marks 921-1~921-4 are wider than the first overlay marks 910-1~910-4. A mark width of the first overlay mark is smaller than a mark width of the third overlay mark along the X direction or the Y direction. A length of the third overlay marks 921-1~921-4 may be larger than or equal to a length of the first overlay marks 910-1~910-4. The third overlay marks 921-1~921-4 may be rectangular. Each of the third overlay marks 921-1~921-4 includes a conductive layer and a barrier layer between the conductive layer and the substrate. The arrangements of the conductive layers and the barrier layers of the third overlay marks 921-1~921-4 may be similar to that of the third overlay marks 621-1~621-4.

In the semiconductor device S4, the overlay mark structure 901B of the semiconductor wafer 30 at least partially overlaps the overlay mark structure 901A of the semiconductor wafer 20. The third overlay marks 921-1 of the overlay mark structure 901B of the semiconductor wafer 30 at least partially overlap the first overlay marks 910-1 of the overlay mark structure 901A of the semiconductor wafer 20 along the Z direction; the third overlay marks 921-2 of the overlay mark structure 901B of the semiconductor wafer 30 at least partially overlaps the first overlay marks 910-2 of the overlay mark structure 901A of the semiconductor wafer 20 along the Z direction; the third overlay marks 921-3 of the overlay mark structure 901B of the semiconductor wafer 30 at least partially overlaps the first overlay mark 910-3 of the overlay mark structure 901A of the semiconductor wafer 20 along the Z direction; the third overlay mark 921-4 of the overlay mark structure 901B of the semiconductor wafer 30 at least partially overlaps the first overlay mark 910-4 of the overlay mark structure 901A of the semiconductor wafer 20 along the Z direction. The first overlay marks 910-1~910-4 of the overlay mark structure 901A of the semiconductor wafer 20 may directly contact the third overlay marks 921-1~921-4 of the overlay mark structure 901B of the semiconductor wafer 30. The second overlay marks 911-1~911-4 of the overlay mark structure 901A of the semiconductor wafer 20 may directly contact the substrate 600B of the semiconductor wafer 30. The third overlay marks 921-1~921-4 of the overlay mark structure 901B of the semiconductor wafer 30 may directly contact the first overlay marks 910-1~910-4 of the overlay mark structure 901A of the semiconductor wafer 20 and the substrate 600A of the semiconductor wafer 20.

Figures 16A, 16B:
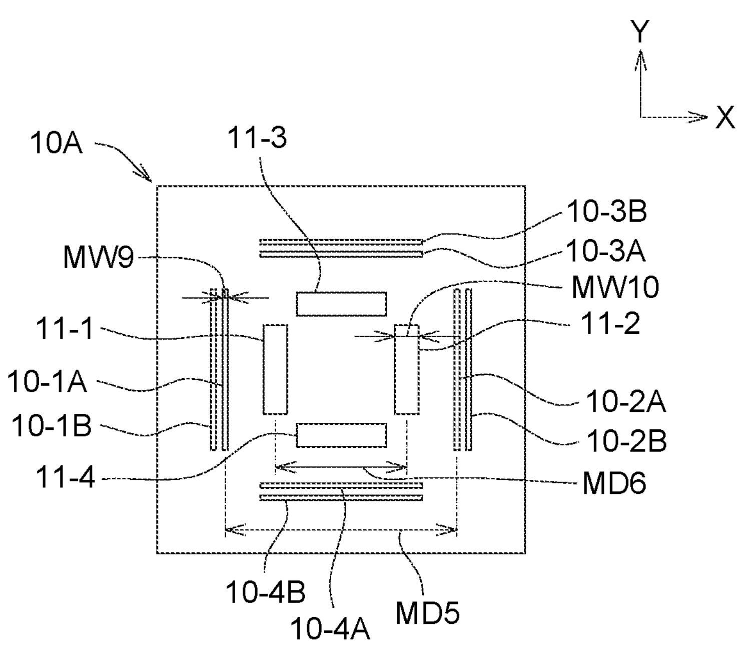
FIGS. 16A to 16B show schematic top views of overlay mark structures according to an embodiment of the present disclosure.
Figure 16C:
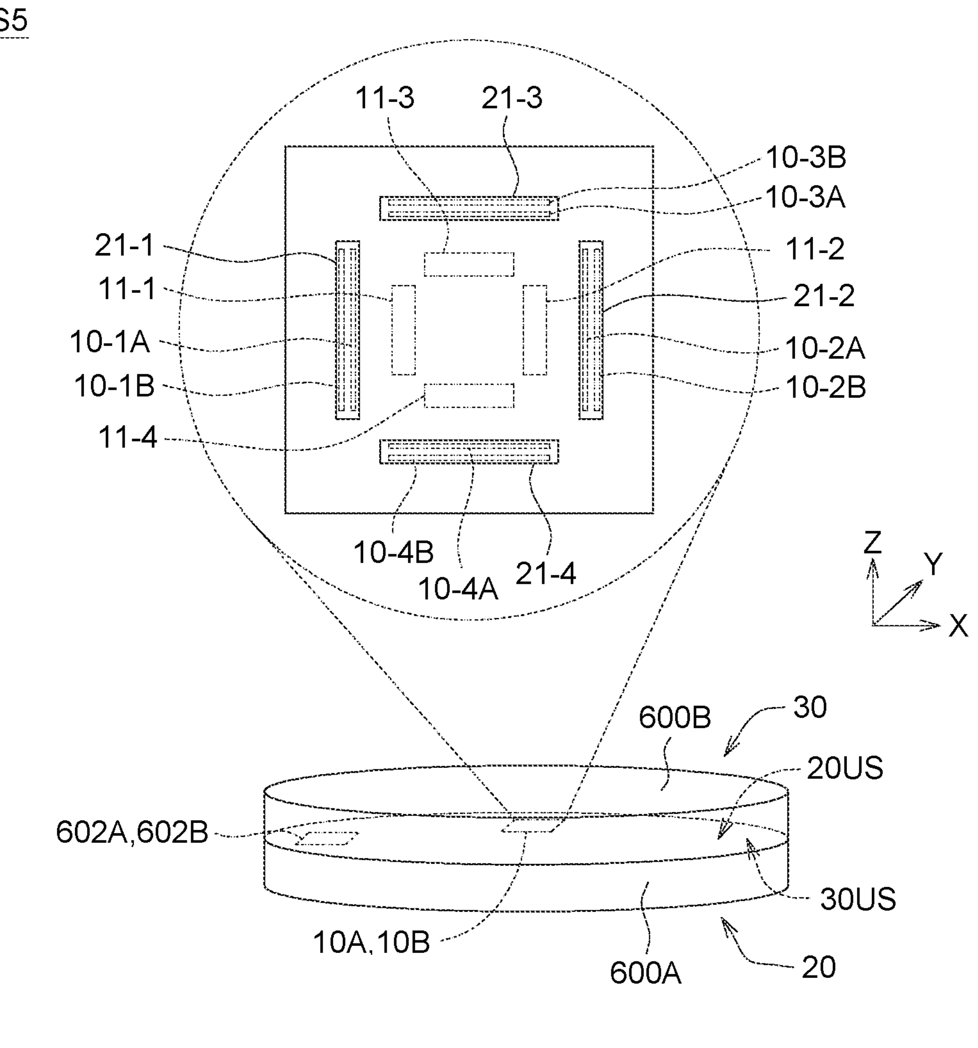
FIG. 16C shows a schematic view of a semiconductor device according to an embodiment of the present disclosure.

Please refer to FIGS. 16A and 16B, which show schematic top views of overlay mark structures 10A and 10B according to an embodiment of the present disclosure. The overlay mark structure 601A of the semiconductor wafer 20 shown in FIG. 6 may be replaced with the overlay mark structures 10A shown in FIG. 16A, and the overlay mark structure 601B of the semiconductor wafer 30 shown in FIG. 6 may be replaced with the overlay mark structures 10B shown in FIG. 13B. A semiconductor device S5 including the overlay mark structures 10A and 10B is provided through the method schematically illustrated in FIGS. 6-12B. FIG. 16C shows a schematic view of the semiconductor device S5 and a schematic top view of the overlay mark structures 10A and 10B.

The overlay mark structure 10A includes first overlay marks 10-1A, 10-1B, 10-2A, 10-2B, 10-3A, 10-3B, 10-4A, 10-4B and second overlay marks 11-1~11-4 separated from each other. The second overlay marks 11-1~11-4 are surrounded by the first overlay marks 10-1A, 10-1B, 10-2A, 10-2B, 10-3A, 10-3B, 10-4A, 10-4B. The first overlay marks 10-1A, 10-1B, 10-2A, 10-2B are arranged along the X direction and extend along the Y direction. The first overlay marks 10-1A, 10-1B are disposed on one side of the second overlay marks 11-1~11-4, and the first overlay marks 10-2A, 10-2B are disposed on another side of the second overlay marks 11-1~11-4 opposite to the side where the first overlay marks 10-1A, 10-1B are disposed. The first overlay marks 10-3A, 10-3B, 10-4A, 10-4B are arranged along the Y direction and extend along the X direction. The first overlay marks 10-3A, 10-3B are disposed on one side of the second overlay marks 11-1~11-4, and the first overlay marks 10-4A, 10-4B are disposed on another side of the second overlay marks 11-1~11-4 opposite to the side where the first overlay marks 10-3A, 10-3B are disposed. The second overlay marks 11-1~11-2 are arranged along the X direction and extend along the Y direction. The second overlay marks 11-3~11-4 are arranged along the Y direction and extend along the X direction. The first overlay mark 10-1A is between the first overlay mark 10-1B and the second overlay mark 11-1. The first overlay mark 10-2A is between the first overlay mark 10-2B and the second overlay mark 11-2. The first overlay mark 10-3A is between the first overlay mark 10-3B and the second overlay mark 11-3. The first overlay mark 10-4A is between the first overlay mark 10-4B and the second overlay mark 11-4. A mark distance MD5 between the first overlay marks 10-1A and 10-2A, which disposed on opposite sides of the second overlay marks 11-1~11-4, is larger than a mark distance MD6 between adjacent two second overlay marks 11-1 and 11-2 along the X direction.

The first overlay marks 10-1A, 10-1B, 10-2A, 10-2B, 10-3A, 10-3B, 10-4A, 10-4B are narrower than the second overlay marks 11-1~11-4. For example, a mark width MW9 of the first overlay mark 10-1A along the X direction is smaller than a mark width MW10 of the second overlay mark 11-2 along the X direction. The first overlay marks 10-1A, 10-1B, 10-2A, 10-2B, 10-3A, 10-3B, 10-4A, 10-4B and the second overlay marks 11-1~11-4 may be rectangular. Each of the first overlay marks 10-1A, 10-1B, 10-2A, 10-2B, 10-3A, 10-3B, 10-4A, 10-4B includes a conductive layer and a barrier layer between the conductive layer and the substrate. The arrangements of the conductive layers and the barrier layers of the first overlay marks 10-1A, 10-1B, 10-2A, 10-2B, 10-3A, 10-3B, 10-4A, 10-4B may be similar to that of the first overlay marks 610-1~610-4. Each of the second overlay marks 11-1~11-4 includes a conductive layer and a barrier layer between the conductive layer and the substrate. The arrangements of the conductive layers and the barrier layers of the second overlay marks 11-1~11-4 may be similar to that of the second overlay marks 611-1~611-4.

The overlay mark structure 10B includes third overlay marks 21-1~21-4. The third overlay marks 21-1~21-4 are arranged in positions that can correspond to the first overlay marks 10-1A, 10-1B, 10-2A, 10-2B, 10-3A, 10-3B, 10-4A, 10-4B. In this embodiment, the third overlay marks 21-1~21-2 are arranged along the X direction and extend along the Y direction. The third overlay marks 21-3~21-4 are arranged along the Y direction and extend along the X direction. The third overlay marks 21-1~21-4 are wider than the first overlay marks 10-1A, 10-1B, 10-2A, 10-2B, 10-3A, 10-3B, 10-4A, 10-4B. A mark width of the first overlay mark is smaller than a mark width of the third overlay mark along the X direction or the Y direction. For example, a mark width MW9 of the first overlay mark 10-1A along the X direction is smaller than a mark width MW11 of the third overlay mark 21-1 along the X direction. A length of the third overlay marks 21-1~21-4 may be larger than or equal to a length of the first overlay marks 10-1A, 10-1B, 10-2A, 10-2B, 10-3A, 10-3B, 10-4A, 10-4B. The third overlay marks 21-1~21-4 may be rectangular. Each of the third overlay marks 21-1~21-4 includes a conductive layer and a barrier layer between the conductive layer and the substrate. The arrangements of the conductive layers and the barrier layers of the third overlay marks 21-1~21-4 may be similar to that of the third overlay marks 621-1~621-4.

In the semiconductor device S5, the overlay mark structure 10B of the semiconductor wafer 30 at least partially overlaps the overlay mark structure 10A of the semiconductor wafer 20. The third overlay mark 21-1 of the overlay mark structure 10B of the semiconductor wafer 30 at least partially overlaps the first overlay marks 10-1A and 10-1B of the overlay mark structure 10A of the semiconductor wafer 20 along the Z direction; the third overlay mark 21-2 of the overlay mark structure 10B of the semiconductor wafer 30 at least partially overlaps the first overlay marks 10-2A and 10-2B of the overlay mark structure 10A of the semiconductor wafer 20 along the Z direction; the third overlay mark 21-3 of the overlay mark structure 10B of the semiconductor wafer 30 at least partially overlaps the first overlay marks 10-3A and 10-3B of the overlay mark structure 10A of the semiconductor wafer 20 along the Z direction; the third overlay mark 21-4 of the overlay mark structure 10B of the semiconductor wafer 30 at least partially overlaps the first overlay marks 10-4A and 10-4B of the overlay mark structure 10A of the semiconductor wafer 20 along the Z direction. The first overlay marks 10-1A, 10-1B, 10-2A, 10-2B, 10-3A, 10-3B, 10-4A, 10-4B of the overlay mark structure 10A of the semiconductor wafer 20 may directly contact the third overlay marks 21-1~21-4 of the overlay mark structure 10B of the semiconductor wafer 30. The second overlay marks 11-1~11-4 of the overlay mark structure 10A of the semiconductor wafer 20 may directly contact the substrate 600B of the semiconductor wafer 30. The third overlay marks 21-1~21-4 of the overlay mark structure 10B of the semiconductor wafer 30 may directly contact the first overlay marks 10-1A, 10-1B, 10-2A, 10-2B, 10-3A, 10-3B, 10-4A, 10-4B of the overlay mark structure 10A of the semiconductor wafer 20 and the substrate 600A of the semiconductor wafer 20.

In other embodiments, the position of the first overlay marks 10-1A, 10-1B, 10-2A, 10-2B, 10-3A, 10-3B, 10-4A, 10-4B and the position of the second overlay marks 11-1~11-4 can be exchanged, and the position of the third overlay marks 21-1~21-4 can be adjusted corresponding to the position of the first overlay marks 10-1A, 10-1B, 10-2A, 10-2B, 10-3A, 10-3B, 10-4A, 10-4B to ensure that the third overlay marks 21-1~21-4 at least partially overlaps the first overlay marks 10-1A, 10-1B, 10-2A, 10-2B, 10-3A, 10-3B, 10-4A, 10-4B.

Figure 17A:
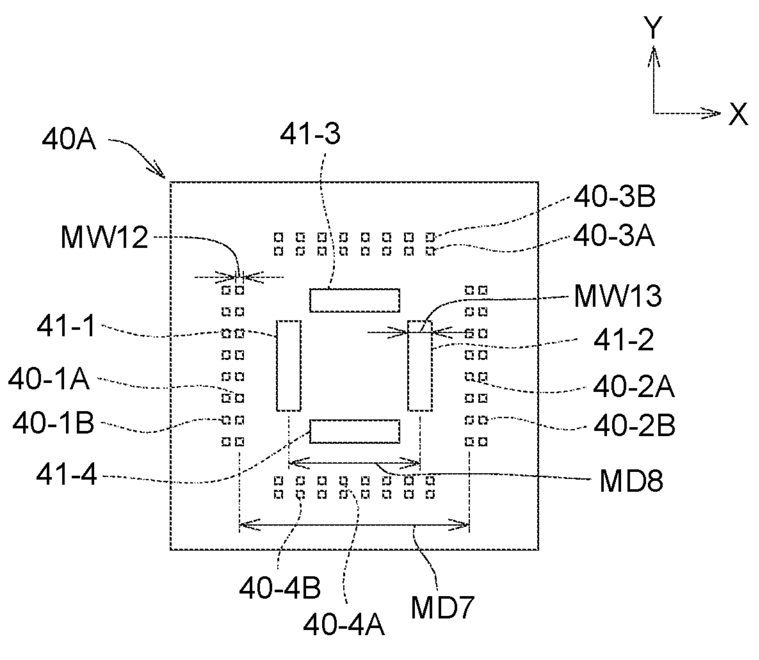
FIGS. 17A to 17B show schematic top views of overlay mark structures according to an embodiment of the present disclosure.
Figure 17B:
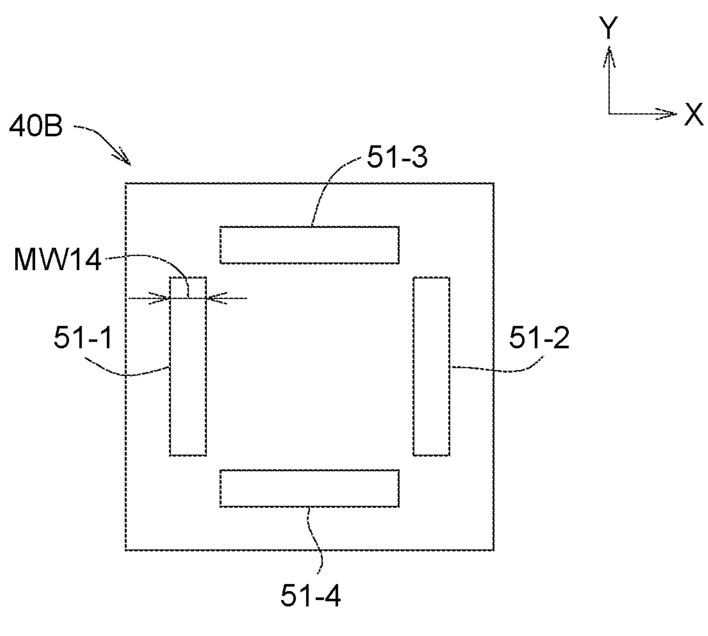
Figure 17C:
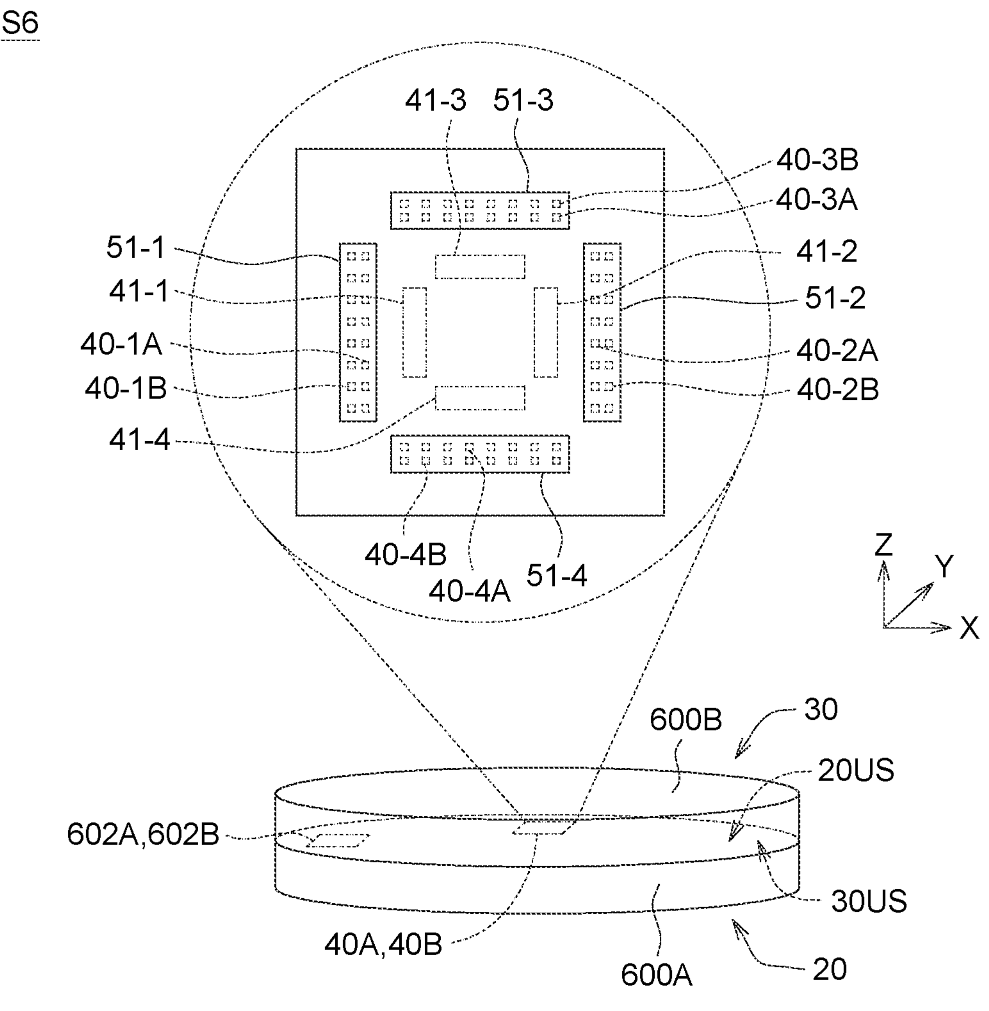
FIG. 17C shows a schematic view of a semiconductor device according to an embodiment of the present disclosure.

Please refer to FIGS. 17A and 17B, which show schematic top views of overlay mark structures 40A and 40B according to an embodiment of the present disclosure. The overlay mark structure 601A of the semiconductor wafer 20 shown in FIG. 6 may be replaced with the overlay mark structures 40A shown in FIG. 17A, and the overlay mark structure 601B of the semiconductor wafer 30 shown in FIG. 6 may be replaced with the overlay mark structures 40B shown in FIG. 17B. A semiconductor device S6 including the overlay mark structures 40A and 40B is provided through the method schematically illustrated in FIGS. 6-12B. FIG. 17C shows a schematic view of the semiconductor device S6 and a schematic top view of the overlay mark structures 40A and 40B.

The overlay mark structure 40A includes first overlay marks 40-1A, 40-1B, 40-2A, 40-2B, 40-3A, 40-3B, 40-4A, 40-4B and second overlay marks 41-1~41-4 separated from each other. The second overlay marks 41-1~41-4 are surrounded by the first overlay marks 40-1A, 40-1B, 40-2A, 40-2B, 40-3A, 40-3B, 40-4A, 40-4B. The first overlay marks 40-1A are arranged along the Y direction and separated from each other. The first overlay marks 40-1B are arranged along the Y direction and separated from each other. The first overlay marks 40-2A are arranged along the Y direction and separated from each other. The first overlay marks 40-2B are arranged along the Y direction and separated from each other. The first overlay marks 40-3A are arranged along the X direction and separated from each other. The first overlay marks 40-3B are arranged along the X direction and separated from each other. The first overlay marks 40-4A are arranged along the X direction and separated from each other. The first overlay marks 40-4B are arranged along the X direction and separated from each other. The first overlay marks 40-1A, 40-1B are disposed on one side of the second overlay marks 41-1~41-4, and the first overlay marks 40-2A, 40-2B are disposed on another side of the second overlay marks 41-1~41-4 opposite to the side where the first overlay marks 40-1A, 40-1B are disposed. The first overlay marks 40-3A, 40-3B are disposed on one side of the second overlay marks 41-1~41-4, and the first overlay marks 40-4A, 40-4B are disposed on another side of the second overlay marks 41-1~41-4 opposite to the side where the first overlay marks 40-3A, 40-3B are disposed. The first overlay marks 40-1A is between the first overlay marks 40-1B and the second overlay mark 41-1. The first overlay marks 40-2A is between the first overlay marks 40-2B and the second overlay mark 41-2. The first overlay marks 40-3A is between the first overlay marks 40-3B and the second overlay mark 41-3. The first overlay marks 40-4A is between the first overlay marks 40-4B and the second overlay mark 41-4. A mark distance MD7 between the first overlay mark 40-1A and the first overlay mark 40-2A, which disposed on opposite sides of the second overlay marks 41-1~41-4, is larger than a mark distance MD8 between adjacent two second overlay marks 41-1 and 41-2 along the X direction.

The first overlay marks 40-1A, 40-1B, 40-2A, 40-2B, 40-3A, 40-3B, 40-4A, 40-4B are narrower than the second overlay marks 41-1~41-4. For example, a mark width MW12 of the first overlay mark 40-1A along the X direction is smaller than a mark width MW13 of the second overlay mark 41-2 along the X direction. The first overlay marks 40-1A, 40-1B, 40-2A, 40-2B, 40-3A, 40-3B, 40-4A, 40-4B may be circular, square or rectangular. The second overlay marks 41-1~41-4 may be rectangular. The present disclosure is not limited thereto. Each of the first overlay marks 40-1A, 40-1B, 40-2A, 40-2B, 40-3A, 40-3B, 40-4A, 40-4B includes a conductive layer and a barrier layer between the conductive layer and the substrate. The arrangements of the conductive layers and the barrier layers of the first overlay marks 40-1A, 40-1B, 40-2A, 40-2B, 40-3A, 40-3B, 40-4A, 40-4B may be similar to that of the first overlay marks 610-1~610-4. Each of the second overlay marks 41-1~41-4 includes a conductive layer and a barrier layer between the conductive layer and the substrate. The arrangements of the conductive layers and the barrier layers of the second overlay marks 41-1~41-4 may be similar to that of the second overlay marks 611-1~611-4.

The overlay mark structure 40B includes third overlay marks 51-1~51-4. The third overlay marks 51-1~51-4 are arranged in positions that can correspond to the first overlay marks 40-1A, 40-1B, 40-2A, 40-2B, 40-3A, 40-3B, 40-4A, 40-4B. In this embodiment, the third overlay marks 51-1~51-2 are arranged along the X direction and extend along the Y direction. The third overlay marks 51-3~51-4 are arranged along the Y direction and extend along the X direction. The third overlay marks 51-1~51-4 are wider than the first overlay marks 40-1A, 40-1B, 40-2A, 40-2B, 40-3A, 40-3B, 40-4A, 40-4B. A mark width of the first overlay mark is smaller than a mark width of the third overlay mark along the X direction or the Y direction. For example, a mark width MW12 of the first overlay mark 40-1A along the X direction is smaller than a mark width MW14 of the third overlay mark 51-1 along the X direction. A length of each of the third overlay marks 51-1~51-4 is larger than a length of each of the first overlay marks 40-1A, 40-1B, 40-2A, 40-2B, 40-3A, 40-3B, 40-4A, 40-4B. The third overlay marks 51-1~51-4 may be rectangular. Each of the third overlay marks 51-1~51-4 includes a conductive layer and a barrier layer between the conductive layer and the substrate. The arrangements of the conductive layers and the barrier layers of the third overlay marks 51-1~51-4 may be similar to that of the third overlay marks 621-1~621-4.

In the semiconductor device S6, the overlay mark structure 40B of the semiconductor wafer 30 at least partially overlaps the overlay mark structure 40A of the semiconductor wafer 20. The third overlay mark 51-1 of the overlay mark structure 40B of the semiconductor wafer 30 at least partially overlaps the first overlay marks 40-1A and 40-1B of the overlay mark structure 40A of the semiconductor wafer 20 along the Z direction; the third overlay mark 51-2 of the overlay mark structure 40B of the semiconductor wafer 30 at least partially overlaps the first overlay marks 40-2A and 40-2B of the overlay mark structure 40A of the semiconductor wafer 20 along the Z direction; the third overlay mark 51-3 of the overlay mark structure 40B of the semiconductor wafer 30 at least partially overlaps the first overlay marks 40-3A and 40-3B of the overlay mark structure 40A of the semiconductor wafer 20 along the Z direction; the third overlay mark 51-4 of the overlay mark structure 40B of the semiconductor wafer 30 at least partially overlaps the first overlay marks 40-4A and 40-4B of the overlay mark structure 40A of the semiconductor wafer 20 along the Z direction. The first overlay marks 40-1A, 40-1B, 40-2A, 40-2B, 40-3A, 40-3B, 40-4A, 40-4B of the overlay mark structure 40A of the semiconductor wafer 20 may directly contact the third overlay marks 51-1~51-4 of the overlay mark structure 40B of the semiconductor wafer 30. The second overlay marks 41-1~41-4 of the overlay mark structure 40A of the semiconductor wafer 20 may directly contact the substrate 600B of the semiconductor wafer 30. The third overlay marks 51-1~51-4 of the overlay mark structure 40B of the semiconductor wafer 30 may directly contact the first overlay marks 40-1A, 40-1B, 40-2A, 40-2B, 40-3A, 40-3B, 40-4A, 40-4B of the overlay mark structure 40A of the semiconductor wafer 20 and the substrate 600A of the semiconductor wafer 20.

In other embodiments, the position of the first overlay marks 40-1A, 40-1B, 40-2A, 40-2B, 40-3A, 40-3B, 40-4A, 40-4B and the position of the second overlay marks 41-1~41-4 can be exchanged, and the position of the third overlay marks 51-1~51-4 can be adjusted corresponding to the position of the first overlay marks 40-1A, 40-1B, 40-2A, 40-2B, 40-3A, 40-3B, 40-4A, 40-4B to ensure that the third overlay marks 51-1~51-4 at least partially overlaps the first overlay marks 40-1A, 40-1B, 40-2A, 40-2B, 40-3A, 40-3B, 40-4A, 40-4B.

In an embodiment, the mark width of the first overlay mark may be 0.2 μm. The mark width of the second overlay mark may be 2 μm. The mark width of the third overlay mark may be 2 μm. However, the dimensions of the first overlay mark, second overlay mark and the third overlay mark should not be limited thereto. The first overlay mark, second overlay mark and the third overlay mark can have any convenient shapes and dimensions which are able to reflect a detection light provided by an optical equipment of the alignment system. The mark width of the first overlay mark is larger than the photo resolution limitation of the optical equipment of the overlay system.

In an embodiment, a semiconductor wafer may include more than one type of overlay mark structures. For example, a semiconductor wafer can includes more than one of the above-mentioned overlay mark structures 601A, 701A, 801A, 901A, 10A and 40A.

In comparative examples, the semiconductor wafer includes only second overlay marks (i.e. the overlay marks with large widths). The planarization processes of the surface treatment processes make the second overlay marks asymmetrical. Such structural asymmetry results in detection error in alignment process and verification process, thereby affecting alignment and overlay accuracy. In comparative examples, the semiconductor wafer includes only first overlay marks (i.e. the overlay marks with smaller widths). The verification process performed after bonding cannot be performed because the first overlay marks are small in size and cannot be detected from the back side of the semiconductor wafer.

In comparative examples, the method for aligning semiconductor wafers includes an alignment process and a verification process, but no measurement process. The deviation value obtain in the alignment process and the initial verification deviation value obtained in the verification process do not show the real opposite position/orientation of semiconductor wafers because structural asymmetry of the overlay marks results in detection error in the alignment process and the verification process. As such, a misalignment between semiconductor wafers occurs.

The present disclosure provides a semiconductor wafer including an overlay mark structure and a semiconductor device including the semiconductor wafer, and the overlay mark structure includes first overlay marks and second overlay marks. A mark width of the first overlay marks is smaller than a mark width of the second overlay marks. The asymmetry problem caused by planarization process is slight in the first overlay marks since the first overlay marks have a smaller mark width. Therefore, the problem of detection error can be improved and the alignment accuracy can be improved.

The present disclosure provides a method for aligning semiconductor wafers, which includes a measurement process including detecting the overlay mark structure of the semiconductor wafer to obtain an offset value before bonding. The offset value corresponds to the structural asymmetry of the overlay marks. The detection error caused by planarization process can be compensated by the measurement process, and alignment accuracy between the semiconductor wafers can be improved. Moreover, the measurement process detects the overlay mark structure from the front side of the semiconductor wafer; the resolution to the overlay mark structure is enhanced as compared with the detection from the back side of the semiconductor wafer, and thus alignment accuracy between the semiconductor wafers can be improved.

The present disclosure is not limited to the above embodiments and can be adjusted or varied properly according to actual demands. For example, the photo-mask may comprise other layers or have other dispositions or arrangements. Otherwise, the semiconductor process may use various step sequences or component configurations, etc. Therefore, the specification and the structures shown in the drawings are used to describe the concepts of the embodiments, and the scope of the invention is not limited thereto. Moreover, it could be understood that the component elements in the embodiments are not limited to the shape and the disposition shown in the drawings, and can be adjusted according to the demand and/or process steps of actual applications without deviating from the spirit of the invention.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor integrated circuit, comprising:

a substrate; and an overlay mark structure in the substrate and comprising first overlay marks and second overlay marks separated from each other, wherein a first mark width of the first overlay marks is smaller than a second mark width of the second overlay marks, wherein the overlay mark structure further comprises third overlay marks separated from each other, a third mark width of the third overlay marks is smaller than the second mark width of the second overlay marks, the first overlay marks are arranged along a first direction, the second overlay marks are arranged along the first direction, the third overlay marks are arranged along the first direction, the second overlay marks are between the first overlay marks and the third overlay marks.

2. The semiconductor integrated circuit according to claim 1, wherein the overlay mark structure further comprises fourth overlay marks separated from each other and arranged along a second direction perpendicular to the first direction, a fourth mark width of the fourth overlay marks is smaller than the second mark width of the second overlay marks, and the second overlay marks are between the first overlay marks and the fourth overlay marks.

3. A semiconductor integrated circuit, comprising:

a substrate; and an overlay mark structure in the substrate and comprising first overlay marks and second overlay marks separated from each other, wherein a first mark width of the first overlay marks is smaller than a second mark width of the second overlay marks, the overlay mark structure further comprises fifth overlay marks separated from each other, the first mark width of the first overlay marks is smaller than a fifth mark width of the fifth overlay marks, the first overlay marks are arranged along a first direction, the second overlay marks are arranged along the first direction, the fifth overlay marks are arranged along the first direction, the first overlay marks are between the second overlay marks and the fifth overlay marks.

4. The semiconductor integrated circuit according to claim 3, wherein the overlay mark structure further comprises sixth overlay marks separated from each other and arranged along a second direction perpendicular to the first direction, the first mark width of the first overlay marks is smaller than a sixth mark width of the sixth overlay marks, and the first overlay marks are between the second overlay marks and the sixth overlay marks.

5. A semiconductor device, comprising:

a first semiconductor wafer comprising a first overlay mark structure, wherein the first overlay mark structure comprises a first overlay mark and a second overlay mark separated from each other, a first mark width of the first overlay mark is smaller than a second mark width of the second overlay mark; and a second semiconductor wafer bonded to the first semiconductor wafer along a first direction and comprising a second overlay mark structure, wherein the second overlay mark structure comprises a third overlay mark, the third overlay mark at least partially overlaps the first overlay mark of the first semiconductor wafer along the first direction.

6. The semiconductor device according to claim 5, wherein a third mark width of the third overlay mark of the second semiconductor wafer is larger than the first mark width of the first overlay mark of the first semiconductor wafer.

7. The semiconductor device according to claim 5, wherein the first overlay mark of the first semiconductor wafer directly contacts the third overlay mark of the second semiconductor wafer.

8. The semiconductor device according to claim 5, wherein the first semiconductor wafer further comprises a first substrate, the first overlay mark structure is in the first substrate, the second semiconductor wafer further comprises a second substrate, the second overlay mark structure is in the second substrate, and the second overlay mark of the first semiconductor wafer directly contacts the second substrate of the second semiconductor wafer.

9. The semiconductor device according to claim 8, wherein the third overlay mark of the second semiconductor wafer directly contacts the first overlay mark and the first substrate of the first semiconductor wafer.

* * * * *